(12) United States Patent
Macfarlane et al.

(10) Patent No.: US 12,113,264 B2
(45) Date of Patent: Oct. 8, 2024

(54) FABRICATION OF SURFACE MOUNT MICROSTRIP CIRCULATORS USING A FERRITE AND CERAMIC DIELECTRIC ASSEMBLY SUBSTRATE

(71) Applicant: SKYWORKS SOLUTIONS, INC., Irvine, CA (US)

(72) Inventors: Iain Alexander Macfarlane, Insch (GB); Scott David Wilson, Cork (IE); David Bowie Cruickshank, Rockville, MD (US); Michael David Hill, Emmitsburg, MD (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 18/494,036

(22) Filed: Oct. 25, 2023

(65) Prior Publication Data
US 2024/0079753 A1   Mar. 7, 2024

Related U.S. Application Data

(62) Division of application No. 17/540,522, filed on Dec. 2, 2021, now Pat. No. 11,843,152.

(60) Provisional application No. 63/121,585, filed on Dec. 4, 2020.

(51) Int. Cl.
| | |
|---|---|
| *H04B 1/40* | (2015.01) |
| *H01P 1/38* | (2006.01) |
| *H01P 11/00* | (2006.01) |
| *H03F 3/24* | (2006.01) |

(52) U.S. Cl.
CPC ............... *H01P 1/38* (2013.01); *H03F 3/245* (2013.01); *H04B 1/40* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 6,529,103 B1 | 3/2003 | Brendel et al. | |
| 7,907,030 B2 * | 3/2011 | Vaughn | H01P 1/387 |
| | | | 333/1.1 |
| 10,403,958 B2 * | 9/2019 | Hanna | H01P 11/006 |
| 11,532,863 B2 * | 12/2022 | Barry | H01P 1/387 |
| 11,848,472 B2 * | 12/2023 | Macfarlane | H01P 1/383 |
| 11,881,610 B2 * | 1/2024 | Musgrove | H01P 11/003 |
| 2006/0139118 A1 | 6/2006 | Vaughn et al. | |
| 2011/0068877 A1 | 3/2011 | Chawla et al. | |
| 2015/0364809 A1 | 12/2015 | Carr et al. | |
| 2017/0104256 A1 | 4/2017 | Bedinger et al. | |

(Continued)

FOREIGN PATENT DOCUMENTS

| | | | | |
|---|---|---|---|---|
| EP | 3261170 A1 | 12/2017 | | |
| WO | WO-2018093771 A1 * | 5/2018 | | H01P 1/387 |

*Primary Examiner* — Pablo N Tran
(74) *Attorney, Agent, or Firm* — Lando & Anastasi, LLP

(57) ABSTRACT

A method of forming an integrated microstrip circulator includes translating a ferrite disc into an aperture in a dielectric substrate, securing the ferrite disc in the dielectric substrate with an adhesive to form a composite structure, and forming circuitry on an upper surface of the composite structure and forming surface mount contacts on a lower surface of the composite structure by metallizing the upper and lower surfaces of the composite structure.

20 Claims, 24 Drawing Sheets

(56) References Cited

U.S. PATENT DOCUMENTS

| | | |
|---|---|---|
| 2017/0133735 A1 | 5/2017 | Volobouev et al. |
| 2018/0166763 A1 | 6/2018 | Cruickshank et al. |
| 2018/0175473 A1* | 6/2018 | Hanna .................... H01R 43/20 |
| 2020/0295425 A1 | 9/2020 | Ohata et al. |
| 2022/0181760 A1 | 6/2022 | Macfarlane et al. |
| 2022/0231393 A1 | 7/2022 | Musgrove et al. |
| 2023/0057627 A1 | 2/2023 | Macfarlane et al. |

* cited by examiner

PORT 3

FABRICATION OF SURFACE MOUNT MICROSTRIP CIRCULATORS USING A FERRITE AND CERAMIC DIELECTRIC ASSEMBLY SUBSTRATE

CROSS-REFERENCE TO RELATED APPLICATIONS

This application claims priority under 35 U.S.C. § 121 as a Division of 35 USC § 119(e) to U.S. patent application Ser. No. 17/540,522, titled "SURFACE MOUNT MICROSTRIP CIRCULATORS USING A FERRITE AND CERAMIC DIELECTRIC ASSEMBLY SUBSTRATE" filed Dec. 2, 2021, which claims priority under 35 U.S.C. § 119 (e) to U.S. Provisional Patent Application Ser. No. 63/121,585, titled "SURFACE MOUNT MICROSTRIP CIRCULATORS USING A FERRITE AND CERAMIC DIELECTRIC ASSEMBLY SUBSTRATE" filed Dec. 4, 2020, the entire contents of each being incorporated herein by reference for all purposes.

BACKGROUND

1. Field of Invention

Embodiments of the disclosure relate to microstrip circulators and isolators useful for 5G systems, for example operating at frequencies of 1.8 GHz and above.

2. Discussion of Related Art

Circulators and isolators are passive electronic devices that are used in high-frequency (e.g., microwave) radio frequency systems to permit a signal to pass in one direction while providing high isolation to reflected energy in the reverse direction. Circulators and isolators commonly include a disc-shaped assembly comprising a disc-shaped ferrite or other ferromagnetic ceramic element, disposed concentrically within an annular dielectric element. Ferrite materials (spinel, hexagonal or garnet) have suitable low-loss microwave characteristics. The annular dielectric element is commonly made of ceramic material.

SUMMARY

In accordance with one aspect, there is provided an integrated microstrip circulator. The integrated microstrip circulator comprises a dielectric substrate having an aperture, a ferrite disc secured within the aperture in the dielectric substrate, metallization on upper surfaces of the dielectric substrate and the ferrite disc, and surface mount contacts disposed on lower surfaces of the dielectric substrate and the ferrite disc and in electrical communication with the metallization on the upper surfaces of the dielectric substrate and the ferrite disc.

In some embodiments, the metallization is circuitry.

In some embodiments, the ferrite disc is a yttrium iron garnet disc.

In some embodiments, the circulator is configured for use in above approximately 3.2 GHz systems.

In some embodiments, the integrated microstrip circulator further includes one or more of a coupler, switch, or load located on the dielectric substrate.

In some embodiments, wherein an inorganic adhesive secures the ferrite disc within the aperture in the dielectric substrate.

In some embodiments, the integrated microstrip circulator further comprises conductive vias disposed on a perimeter of the dielectric substrate and providing electrical connection between the surface mount contacts and the metallization on the upper surfaces of the dielectric substrate and ferrite disc.

In accordance with another aspect, there is provided a method of forming an integrated microstrip circulator. The method comprises preparing a ferrite disc, preparing a dielectric substrate, the dielectric substrate having an aperture, translating the ferrite disc into the aperture in the dielectric substrate, securing the ferrite disc in the dielectric substrate with an adhesive to form a composite structure, and forming circuitry on an upper surface of composite structure and forming surface mount contacts on a lower surface of the composite structure by metallizing the upper and lower surfaces of the composite structure.

In some embodiments, the ferrite disc is a yttrium iron garnet disc.

In some embodiments, the method further comprises forming vias on sections of a peripheral surface of the dielectric substrate, the vias providing electrical communication between the circuitry and the surface mount contacts.

In some embodiments, the method further comprises adding additional radio frequency components onto the dielectric substrate.

In some embodiments, the method further comprises slicing the composite structure to a particular thickness, wherein each slice contains both a portion of the ferrite disc and a portion of the dielectric substrate.

In some embodiments, the method further comprises contacting a magnetic disc onto the composite structure to form a microstrip waveguide circulator.

In some embodiments, the adhesive is an inorganic adhesive.

In some embodiments, the method further comprises applying one or more of a coupler, switch, or load to the dielectric substrate.

In accordance with another aspect, there is provided a radio frequency antenna system. The system comprises a microstrip circulator surface mounted on an external substrate. The microstrip circulator includes a dielectric substrate having an aperture, a ferrite disc secured within the aperture in the dielectric substrate, metallization on upper surfaces of the dielectric substrate and ferrite disc, and surface mount contacts disposed on lower surfaces of the dielectric substrate and ferrite disc and in electrical communication with the metallization on the upper surfaces of the dielectric substrate and ferrite disc. The system further comprises a transmit power amplifier a receive low noise amplifier, and a filter.

In some embodiments, the system further comprises a semiconductor amplifier.

In some embodiments, the system further comprises at least one of a coupler, switch, or load located on the dielectric substrate.

In some embodiments, the system is configured to operate as a 5G system.

In some embodiments, the ferrite disc is secured within the aperture in the dielectric substrate with an inorganic adhesive.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation and are not intended as a definition of the limits of the invention. In the drawings.

DETAILED DESCRIPTION

Disclosed herein are embodiments of integrated architectures for use in radiofrequency (RF) and/or electronic environments. The integrated architectures can include microstrip circulators that can be formed using a dielectric tile substrate. Specifically, a ferrite disc can be embedded into a dielectric substrate and secured within the dielectric substrate with an adhesive to form an integrated microstrip circulator which may then serve as a platform for other components, such as circuitry. In some embodiments, a stripline (tri-plate) circulator can be formed as well using embodiments discussed herein.

Embodiments of the disclosure could advantageously allow for 5G systems, in particular operating at 1.8 GHz and above or 3.2 GHz and above (and in some embodiment 3 GHz and above), to form integrated architectures which can include different components, such as antennas, circulators, amplifiers, and/or semiconductor based amplifiers. By allowing for the integration of these components onto a single substrate, this can improve the overall miniaturization of the device. In some embodiments, the disclosed devices can be operable at frequencies between about 1.8 GHz and about 30 GHz. In some embodiments, the disclosed device can be operable at frequencies of greater than about 1, 2, 3, 4, 5, 10, 15, 20, or 25 GHz. In some embodiments, the disclosed device can be operable at frequencies of less than 30, 25, 20, 15, 10, 5, 4, 3, or 2 GHz.

In some embodiments, the integrated architecture can include a directional coupler and/or isolator in a package size which is not much larger than a standard isolator, or equivalent in size to a standard isolator. In some embodiments, the integrated architecture can include a high power switch. In addition to using the dielectric tile as a substrate for an impedance transformer, it could also be used as the substrate for the coupler, switch and termination.

Figure 1:
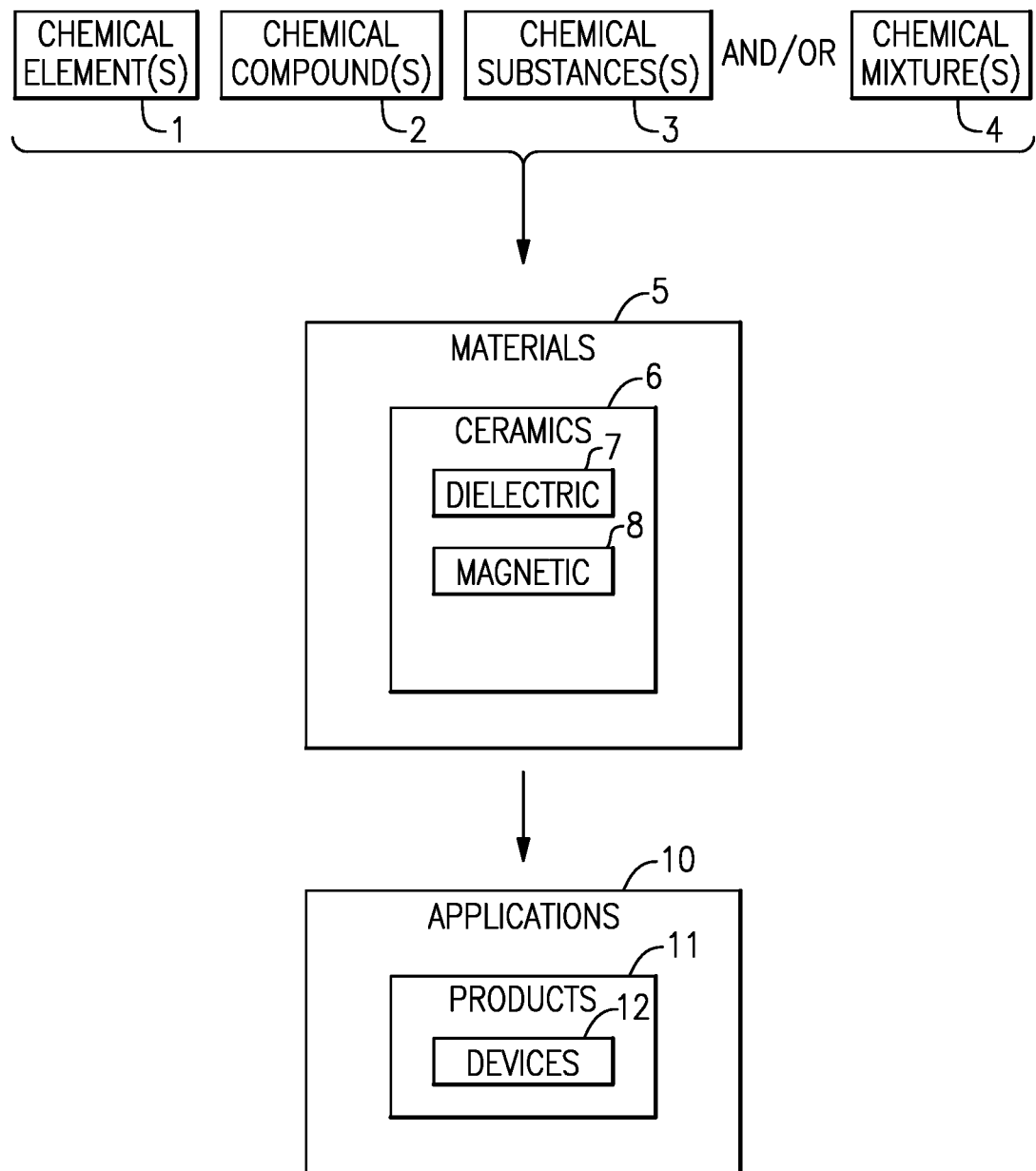
FIG. 1 schematically shows how materials having one or more features described herein can be designed, fabricated, and used.

FIG. 1 schematically shows how one or more chemical elements (block 1), chemical compounds (block 2), chemical substances (block 3) and/or chemical mixtures (block 4) can be processed to yield one or more materials (block 5) having one or more features described herein. In some embodiments, such materials can be formed into ceramic materials (block 6) configured to include a desirable dielectric property (block 7), and/or a desirable magnetic property (block 8).

In some embodiments, a material having one or more of the foregoing properties can be implemented in applications (block 10) such as radio-frequency (RF) applications. Such applications can include implementations of one or more features as described herein in devices 12. In some applications, such devices can further be implemented in products 11. Examples of such devices and/or products are described herein.

Microstrip Circulators/Isolators

Circulators are passive multiport devices which can receive and transmit different signals, such as microwave or radiofrequency (RF) signals. These ports can be an external waveguide or transmission line which connects to and from the circulator. Isolators are similar to circulators, but one or more of the ports can be terminated. Hence, the terms circulator and isolator can be used interchangeably herein as they can be similar in general structure. Thus, all discussion below can apply both to circulators and isolators. Further, the circulators and isolators can be known as circulator packages and isolator packages, for example if they include extra components discussed herein.

Figure 2:
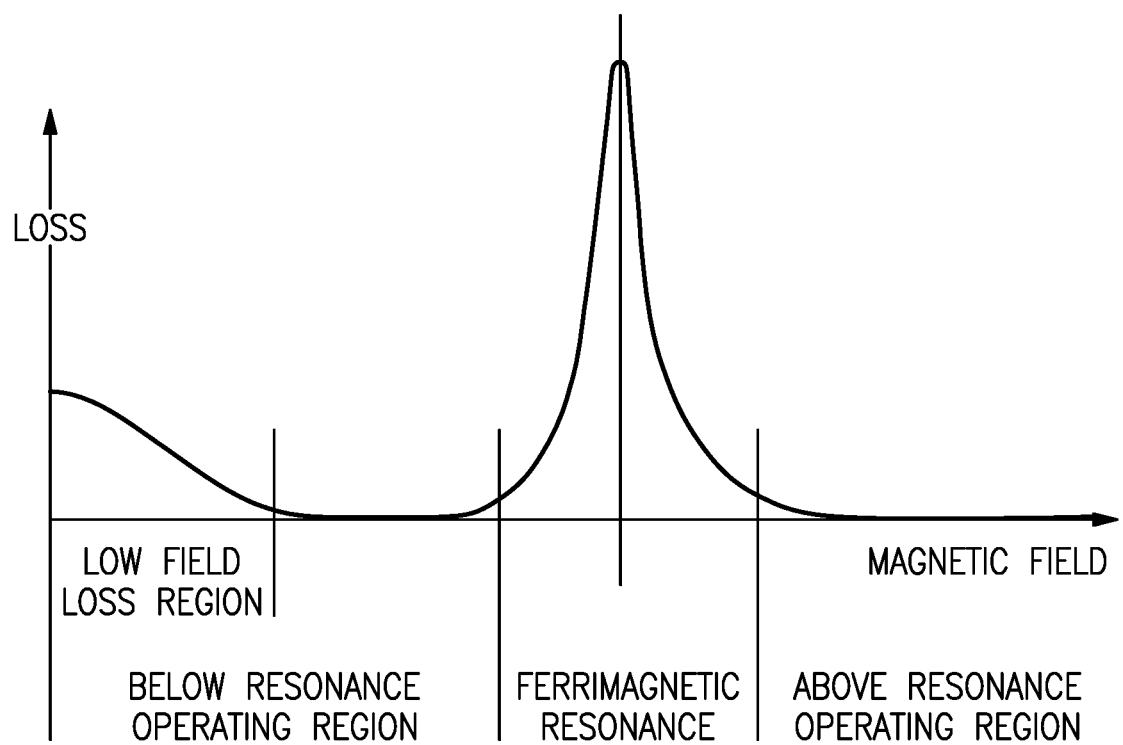
FIG. 2 illustrates a magnetic field v. loss chart.

Circulators generally can operate in either of above resonance or below resonance operating regions. This is shown in FIG. 2. In some embodiments, above-resonance frequencies can be advantageous for narrow band, sub 4 GHz circulators. For higher frequencies, the below resonance region can be more advantageous.

Previously, some all-ferrite microstrip circulators have been used for radar transmit/receive modules. Circuitry can be printed onto the all-ferrite microstrip circulator and a magnet can be added on top to direct the signal. For example, a metallization pattern is formed onto a ferrite substrate. Typically, the metallization pattern consists of a central disc and multiple transmission lines.

Microstrip circulators typically work in the below resonance operating region. They use a very small magnet or can be self-biased, such as in the case of hexagonal ferrites. However, square tiles can be a difficult shape to magnetize uniformly, in particular for the all-ferrite microstrip circulators known in the art. Thus, they will operate close to the low field loss region. When transformers are mounted on the lossy unmagnetized ferrite, performance suffers. Further, increased power will make the poor performance even more apparent. Thus, circulators known in the art suffer from issues due to the ferrite tile being poorly magnetized, leading to poor insertion loss and intermodulation distortion (IMD), and degraded power performance.

Additionally, microstrip transmission lines suffer from increasing problems with higher frequencies, such as "overmoding." To avoid "overmoding," that is the creation of unwanted modes in the microstrip line, it can be advantageous to use thinner substrates and lower dielectric constants at higher frequencies, such as disclosed below. However, this, in turn, can lead to radiation from open microstrip with consequent losses and unwanted "box" modes in a transceiver enclosure.

Microstrip Circulators/Isolators

Embodiments of the disclosure can improve overall magnetization and reduce performance issues that can occur for currently known circulators/isolators, and in particular for microstrip circulators/isolators. Generally, the microstrip circulators/isolators can be formed by embedding a ferrite disc, such as an oxide ferrite disc or a disc made of yttrium iron garnet (YIG), into a dielectric substrate (for example in a hole/aperture), such as a high dielectric substrate. Unlike previously known methodologies, during the ceramic formation process, the combination of ferrite disc and dielectric substrate can be adhered together with an inorganic adhesive to form a composite structure. Some examples of inorganic adhesives that may be utilized in embodiments disclosed herein include, but are not limited to, Ferro EG 2998 (Ferro Corporation), Aremco Ceramabond 503-VFG-C (Aremco Products Inc.), and Specialty Glass SP831. The assembly can then be metallized, thus providing the base for microstrip circulators/isolators. In some embodiments, metallized traces may be provided on the perimeter of the dielectric substrate to connect to metallization on the face of the assembly. The metallized traces on the perimeter of the dielectric substrate may provide for surface mounting the microstrip circulator/isolator on a printed circuit board or other base substrate.

Advantageously, the adhesive bonding of the dielectric substrate and ferrite disc can be performed without negatively impacting, or without significantly negatively impacting, the properties of either the ferrite disc or the dielectric substrate. Embodiments of these assemblies can be used as microstrip circulators/isolators for radiofrequency applications, such as for 5G applications.

One previously known method of production of such magnetic-dielectric assemblies is to use an organic adhesive to glue a ceramic ferrite rod into a ceramic dielectric tube, followed by cutting using an annular saw. The cut segments are cut oversize then ground to final thickness and flatness. Assemblies using organic adhesives often heat up during machining, causing the adhesive to swell at the cut surface, producing a surface bump and reducing overall surface smoothness, which may affect the performance of devices such as isolators. In addition, softened adhesive may in some cases adhere to portions of the cutting blade, causing it to flex or bend, also reducing the smoothness and/or increasing the variation in thickness of the cut magnetic-dielectric assemblies. Many organic adhesives have a significant high frequency magnetic and/or electric loss tangent. Further many organic adhesives are unable to withstand temperatures at which metallization of the magnetic-dielectric assembly is performed, making it difficult, if not impossible to metallize the magnetic-dielectric assembly.

Methods previously used to avoid these issues are the use of all-ferrite circulators/isolators, though these have significant drawbacks as discussed above. Thus, embodiments of the disclosure alleviate many of the issues known in the art by allowing the dielectric substrate and ferrite disc to be joined with an inorganic adhesive having sufficient temperature resistance such that metallization may be applied without degrading the inorganic adhesive.

Suitable ferrite materials that may be utilized in embodiments disclosed herein include synthetic garnets, such as those disclosed in U.S. Pat. No. 10,773,972, incorporated herein by reference. Table I illustrates examples of ferrites that may be suitable for use in embodiments disclosed herein with different operating frequencies. Each of these materials are available from Skyworks Solutions, Inc.

TABLE 1

Example Ferrite materials

| Frequency | Saturation Magnetization (Material) |
|---|---|
| 2.0-2.5 GHz | 700-800 gauss (TTHiE-700) |
| 3.0-3.5 GHz | 900-1000 gauss (TTHiE-950) |
| 4.0-4.2 GHz | 1100-1200 gauss (TTHiE-1000) |
| 5.0-5.5 GHz | 1400 gauss (TTHiE-1400) |
| 6.0-6.5 GHz | 1600 gauss (TTHiE-1600 or TTVG-1600) |
| 7.0-7.5 GHz | 1800 gauss (G-113) |
| 8.0-8.5 GHz | 1850-1900 gauss (TTVG-1850, TTVG-1900) |
| >9 GHz | Spinel Ferrites |

While Table 1 illustrates a number of ferrite materials, it will be understood that the disclosure is not so limited to the above materials, and that other materials can be used as well. For example, garnets, spinels, ferrites, oxides, molybdates, tungstates, titanates, vanadates, and pyrocholores can all be used.

Additional circuitry, connections, etc., such as formed from silver or other metalized substances, can be added to an assembly for the microstrip circulators/isolators.

Any number of different disc materials can be used, such as ferrite materials discussed above in Table 1. In some embodiments, the saturation magnetization levels of the ferrite disc material can range between 1000-5000 (or about 1000 to about 5000) gauss. In some embodiments, the saturation magnetization levels of the ferrite disc material can range between 4000-5000 (or about 4000 to about 5000) gauss. In some embodiments, the saturation magnetization levels of the ferrite disc material can be 1000, 2000, 3000, 4000, or 5000 gauss. In some embodiments, the saturation magnetization levels of the ferrite disc material can be greater than 1000, 2000, 3000, 4000, or 5000 gauss. In some embodiments, the saturation magnetization levels of the ferrite disc material can be less than 1000, 2000, 3000, 4000, or 5000 gauss. In some embodiments, the ferrite disc can be a magnetic oxide. In some embodiments, the ferrite disc can be a yttrium iron garnet.

Further, any number of different dielectric substrates known in the art can be used including, for example, any of BaWO4+ additives, Na, Li Molybdate Spinels, Mg—Al—Ca—Zn Titanates, Bi Pyrochlores, Li, Na, Bi Vanadate/Molybdate/Tungstate based Scheelites, Na, Li, ca, Mg, Zn, and Vanadate Garnets as disclosed in U.S. Patent Publication No. 2018/0166763, incorporated herein by reference. In some embodiments, the dielectric can be formed from dielectric powder or low temperature co-fired ceramic (LTCC) tape. In some embodiments, the dielectric constant of the dielectric substrate can be below approximately 4 and above 6, 10, 15, 20, 25, 30, 40, 50, 60, 100, or 150. In some embodiments, the dielectric constant of the dielectric substrate can range from 6-30 (or about 6 to about 30). In some embodiments, the dielectric constant of the dielectric substrate can be below about 150, 100, 60, 50, 40, 30, 25, 20, 15, or 10. In some embodiments, the dielectric constant of the dielectric substrate can range from 10-40 (or about 10 to about 40). In some embodiments, the dielectric constant of the dielectric substrate can range from 4-10 (or about 4 to about 10). In some embodiments, the dielectric constant of the dielectric substrate can range from 40-100 (or about 40 to about 100).

Assemblies for Microstrip Circulators/Isolators

Figure 3A:
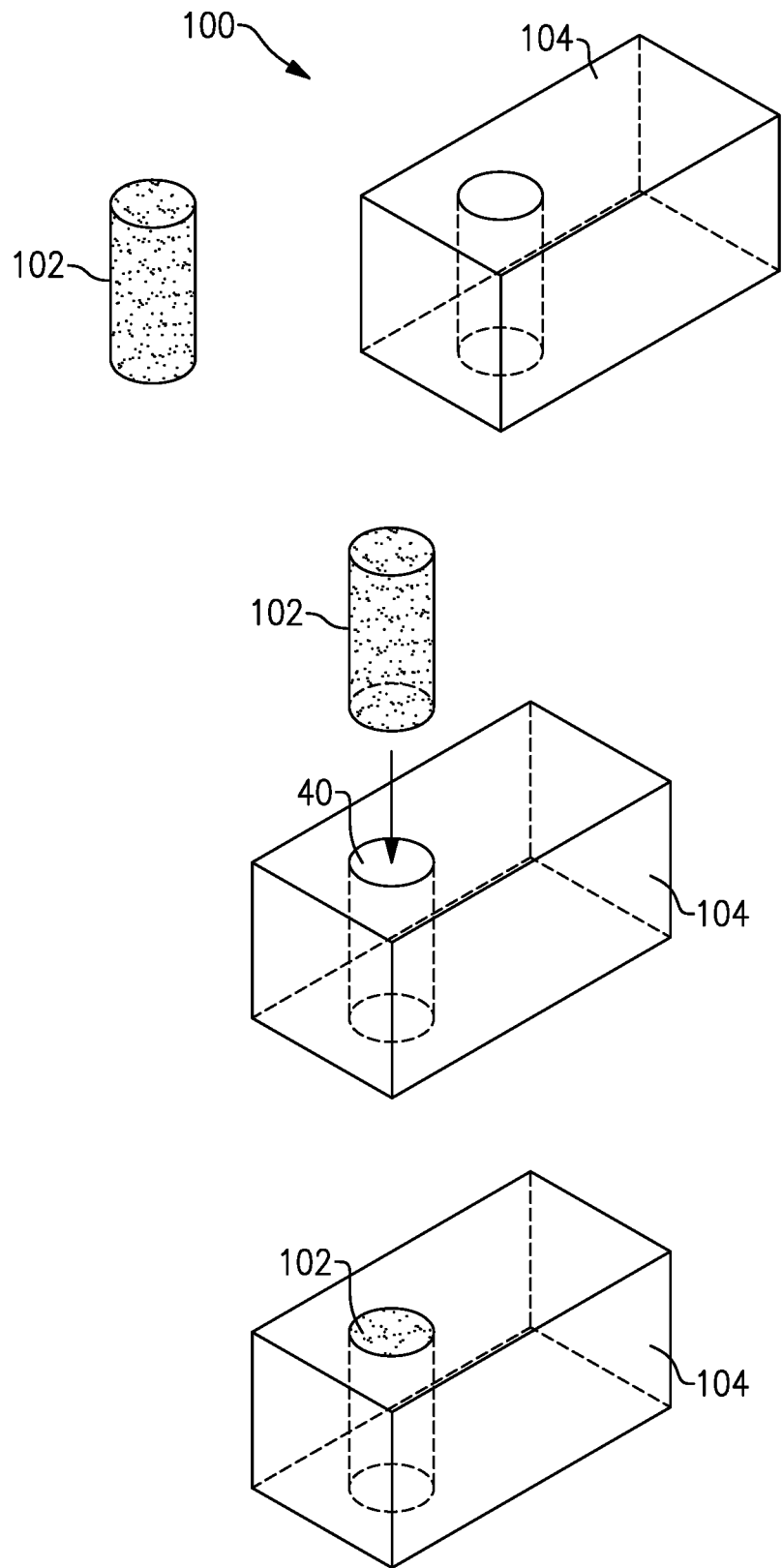
FIG. 3A illustrates an embodiment of a composite structure having a ferrite cylinder within a rectangular prism dielectric substrate.

To form an embodiment of a circulator/isolator 100, a ferrite disc 102, or other magnetic disc, can be inserted into an aperture of a dielectric substrate 104 as shown in FIG. 3A. In some embodiments, the disc 102 can be a cylindrical rod, though the particular shape is not limiting. The disc 102 can be green, previously fired, or not-previously fired.

Figure 3B:
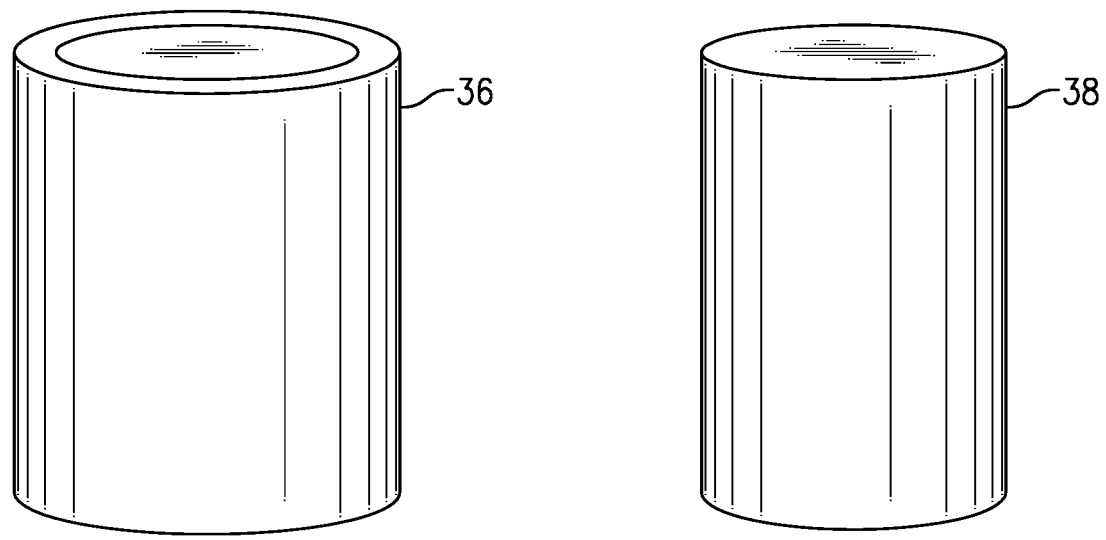
FIGS. 3B-3D illustrates an embodiment of a composite structure having a ferrite cylinder within a tubular dielectric substrate.
Figure 3C:
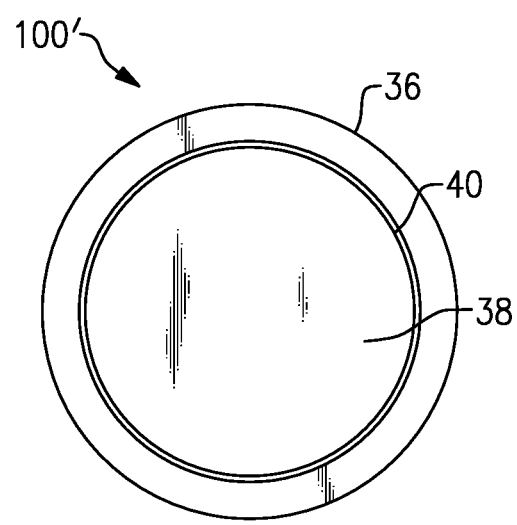
Figure 3D:
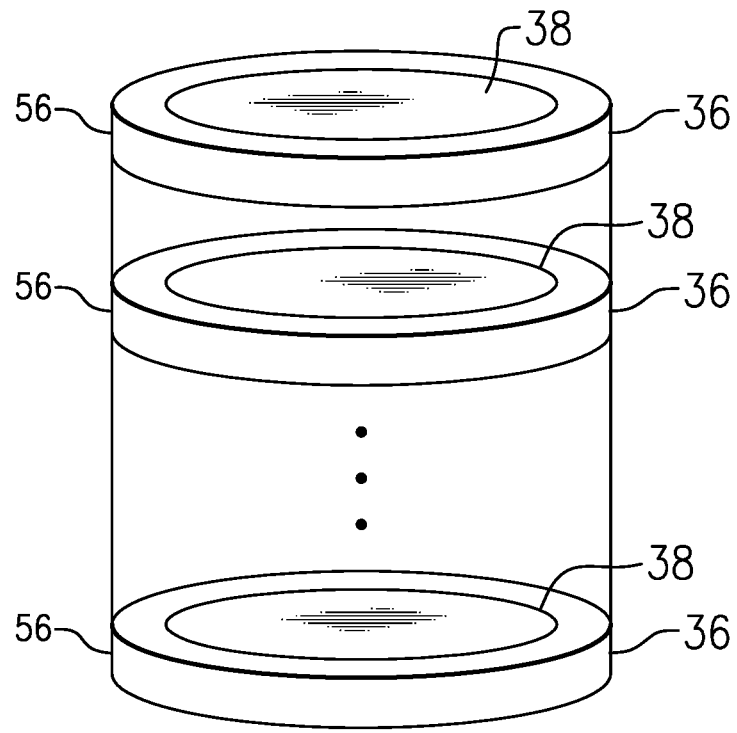
Figure 3E:
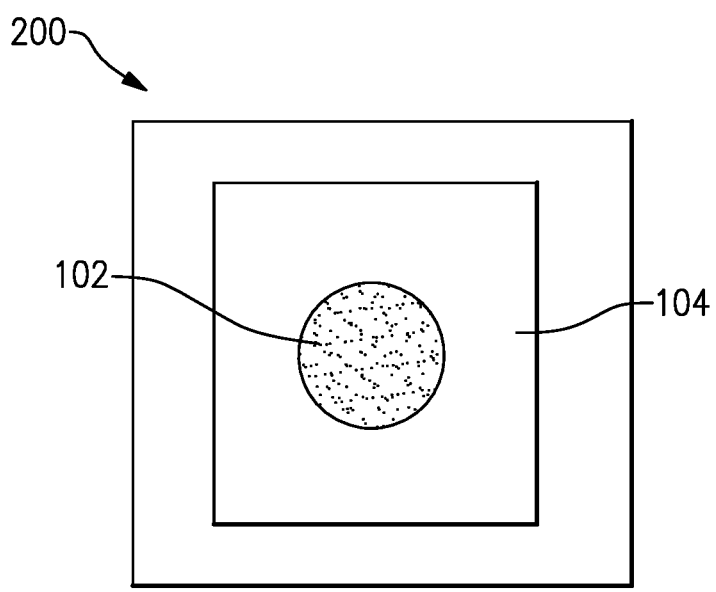
FIG. 3E illustrates an embodiment of a composite tile.

Further, the substrate 104 can generally be a rectangular shape as shown, but other shapes can be used as well. For example, as illustrated in FIGS. 3B and 3C, a ferrite rod 38 may be inserted within a dielectric tube 36 to form an assembly with a circular cross-section. Once the disc 102 is inside the substrate 104, the components can be secured together with an inorganic adhesive 40 which may be inserted into the aperture in the dielectric substrate prior to inserting the ferrite disc or rod. This composite structure 100, 100' can then be sliced or sawed to form separate dielectric-ferrite discs 56 as illustrated in FIG. 3D or rectangular or square-shaped dielectric-ferrite structures 200, termed "a tile" herein as illustrated in FIG. 3E. In some embodiments, a plurality of different discs can be inserted into a single substrate in a plurality of different apertures.

Figure 3F:
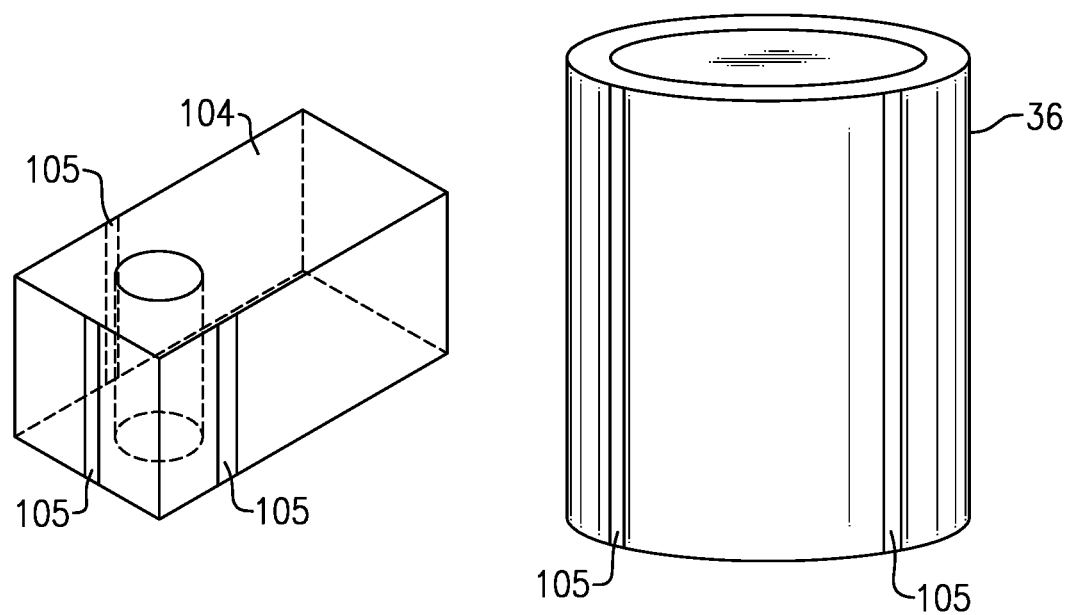
FIG. 3F illustrates metallization that may be applied to external perimeters of a dielectric substrate for forming a circulator/isolator.

In some embodiments, prior to or after securing the ferrite rod/disc within the dielectric substrate, strips of metallization 105 may be deposited on the external perimeter of the dielectric substrate, as illustrated in FIG. 3F. The strips of metallization 105 may be deposited within recesses that were previously molded or cut into the perimeter of the dielectric substrate. As explained further below, these strips may allow for surface mounting of circulators/isolators formed of the dielectric-ferrite assemblies and provide electrical contacts to metallization of the surface mounted circulators/isolators.

Thus, in some embodiments a ferrite disc can be mounted into a square or rectangular dielectric substrate, or any other shaped substrate, which can then serve as a platform for other components, such as circuitry, magnets, switches, couplers, amplifiers, etc. This composite structure can then be magnetized to serve as a microstrip or circulator and/or isolator package, for example, or the ferrite disc could have been magnetized prior to insertion. In some embodiments, the ferrite disc can be magnetized prior to the co-firing step.

Thus, using a process as disclosed herein, a ferrite disc 102 can be embedded into a dielectric substrate 104 to form an assembly 200 (also referred to herein as a tile), as shown in FIG. 3E. The thin ferrite disc shown in the figure can be significantly easier to magnetize uniformly than a square, or other oddly shaped piece, known in the art. In some embodiments, the dielectric substrate (and dielectric-ferrite tile) could be about 25 mm square though the particular dimensions are not limiting. This can be used in the 3-4 (or about 3-about 4) GHz region, but the frequency is not limiting.

Figure 4A:
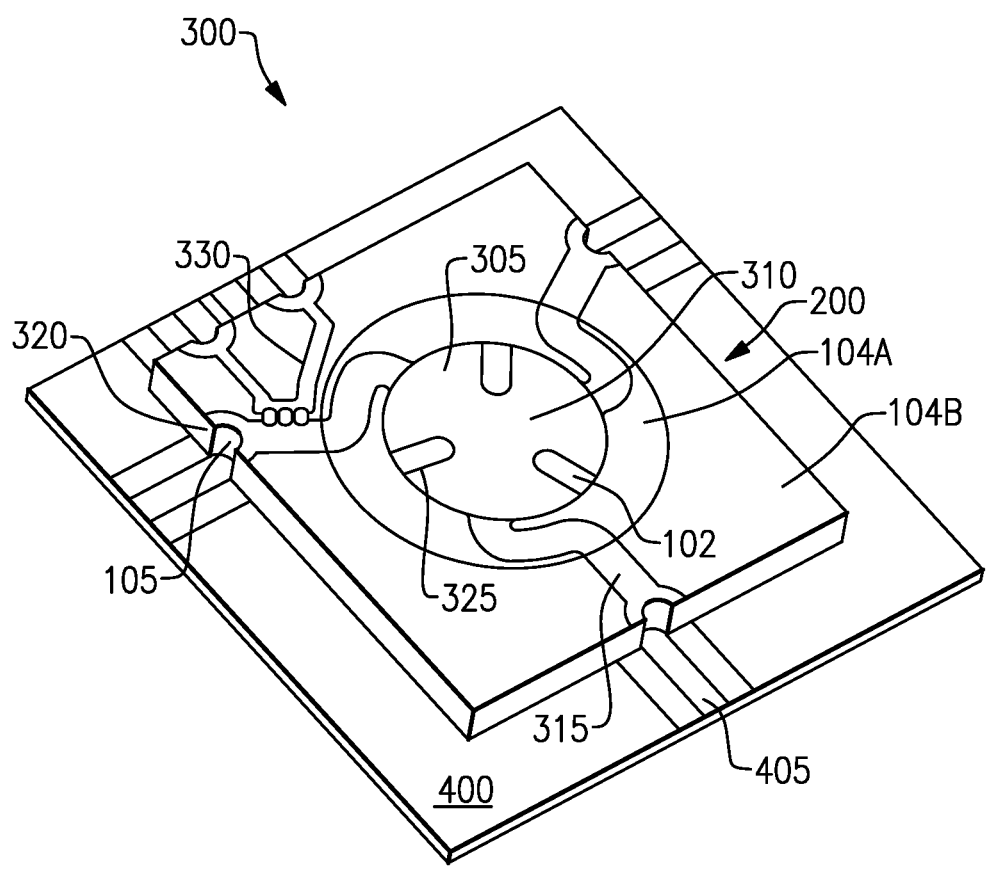
FIG. 4A illustrates an integrated microstrip circulator without a magnet.

Using the dielectric-ferrite tile assembly 200, a circulator/isolator 300 can then be produced as shown in FIG. 4A. The circulator/isolator 300 is formed by depositing a layer of metal 305, for example, silver on the upper surface of the dielectric-ferrite tile assembly 200, or, alternatively, on a dielectric-ferrite disc assembly 56 as illustrated in FIG. 3D. The layer of metal 305 may be patterned to form a disc 310 above the ferrite disc 102 and conductive traces 315 that may couple different portions of the perimeter of the metal disc 310 to the strips of metallization 105 disposed on the periphery of the dielectric-ferrite tile assembly 200, for example, disposed within recesses 320 formed in the periphery of the dielectric-ferrite tile assembly 200. The strips of metallization 105 may be used to electrically couple the conductive traces 315 to an external component, for example, to metal traces on a circuit board through lower side surface mount contacts as disclosed in further detail below, and may thus be referred to herein as vias. Formation of the strips or metallization/vias 105 in the recesses 320 may provide advantages of providing for the width of the metallization to be more easily controlled and making it easier to achieve a good solder connection when the circulator/isolator 300 is mounted on an external substrate, for example, a printed circuit board. In other embodiments, the recesses 320 may be omitted and the vias 105 may be formed on a flat peripheral surface of the dielectric tile assembly 200 (or curved peripheral surface in embodiments in which the dielectric tile assembly 200 is in the form of a ring.) The circulator/isolator 300 may be surface mounted on a printed circuit board 400 or other external substrate. The strips of metallization 105 may be bonded to metal traces 405 on the printed circuit board 400 to provide a surface mount electrical connection between the circulator/isolator 300 and other components mounted on the printed circuit board 400 or elsewhere.

In some embodiments, the metal disc 310 may be patterned to include cutouts 325 that provide the metal disc 310 with a tri-lobed shape. Each of the traces 315 may be coupled to the disc 310 at positions equidistant between adjacent cutouts 325. The traces 315 form the three port of the circulator/isolator. The cutouts 325 may function to decrease the operating frequency of the circulator/isolator 300. Decreasing the operating frequency means that for a given frequency the part can be realized in a smaller size.

In some embodiments, the conductive traces 315 may be curved or otherwise patterned in a non-linear shape. The curves in the conductive traces 315 may provide for a greater length of the conductive traces 315 to be disposed on the dielectric material of the circulator/isolator 300 to provide a longer impedance transformer than if the conductive traces 315 were straight lines. The desired length of the impedance transformer is also fixed by the operating frequency, so if the impedance transformer can be wrapped around the circumference this is a further means of reducing the size of the part for a given frequency. In some embodiments, the dielectric tile 104 may include an inner area 104A and an outer area 104B that are adhesively bonded or co-fired together. The material of the inner area 104A may have a different, for example, higher dielectric constant than material of the outer area 104B. The conductive traces 315 may be curved to have a greater length area over the inner area 104A than they otherwise might if not curved.

Figure 4B:
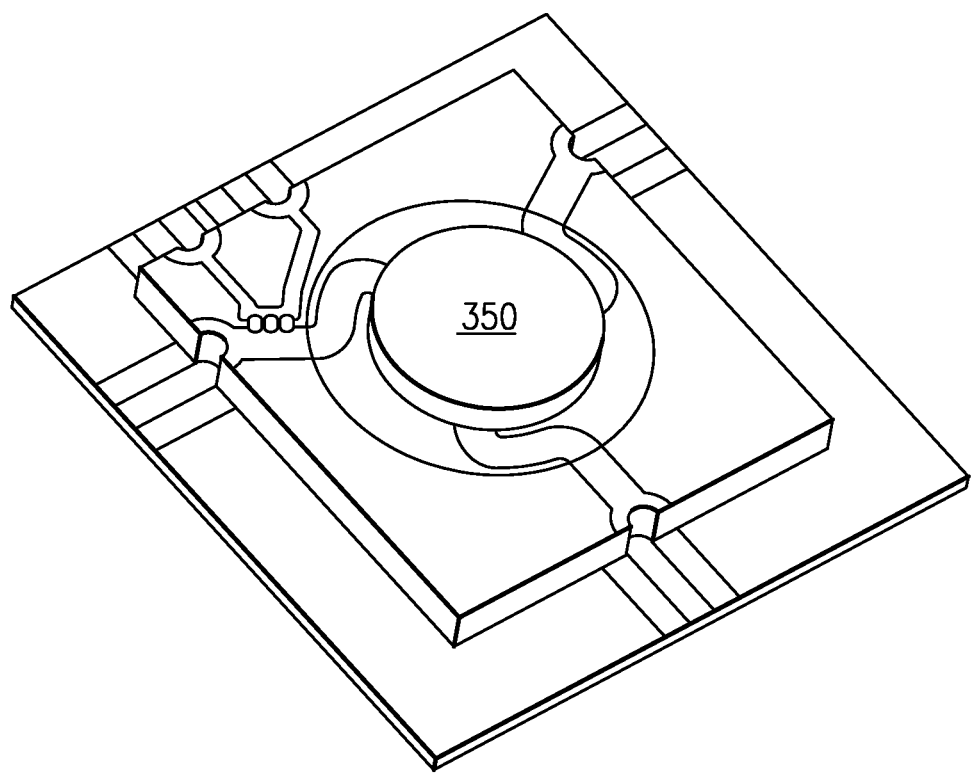
FIG. 4B illustrates an integrated microstrip circulator with a magnet.

As shown, the substrate 104 has space left over for other component attachments, for example, a coupler 330. After forming the circulator/isolator 300, only a small magnet 350 needs to be placed on the tile, as shown in FIG. 4B. Thus, assembly is much less complex than previously done. The electrical path length through the circulator/isolator 300 depends on frequency and dielectric constant of the substrate.

In addition to using the dielectric tile 104 as the substrate for the circulator/isolator 300, it could also be used as the substrate for a coupler 330 as illustrated in FIG. 4A, and/or for a switch and termination. Thus, a number of other components can be added onto the substrate, reducing the overall footprint of the device. Further, circuit metallization could be added. Microstrip isolators/circulators can be used as interstage isolators in the amplifier chain, as switched circulators as part of TDD designs or as circulators in FDD designs.

Figure 5A:
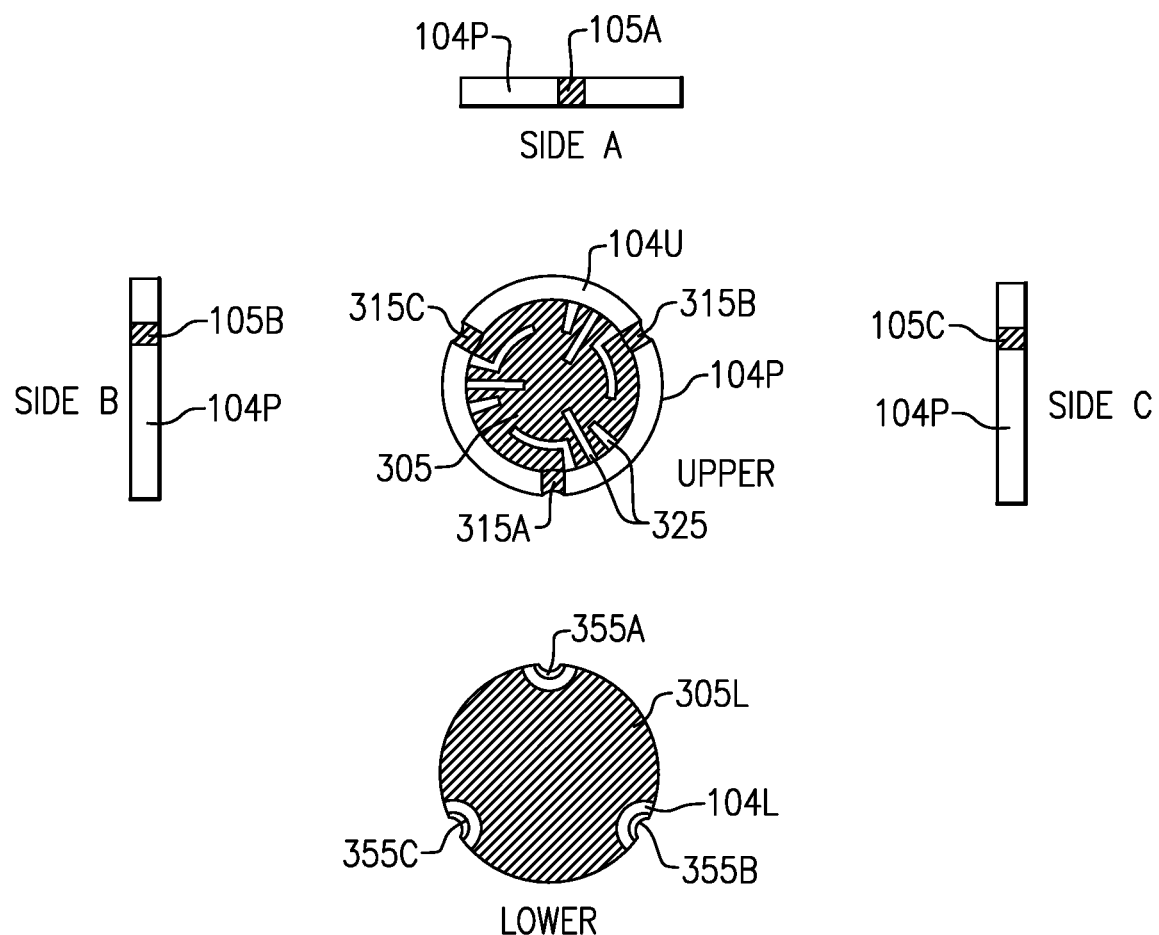
FIG. 5A illustrates an example of a microstrip circulator from various sides.
Figure 5B:
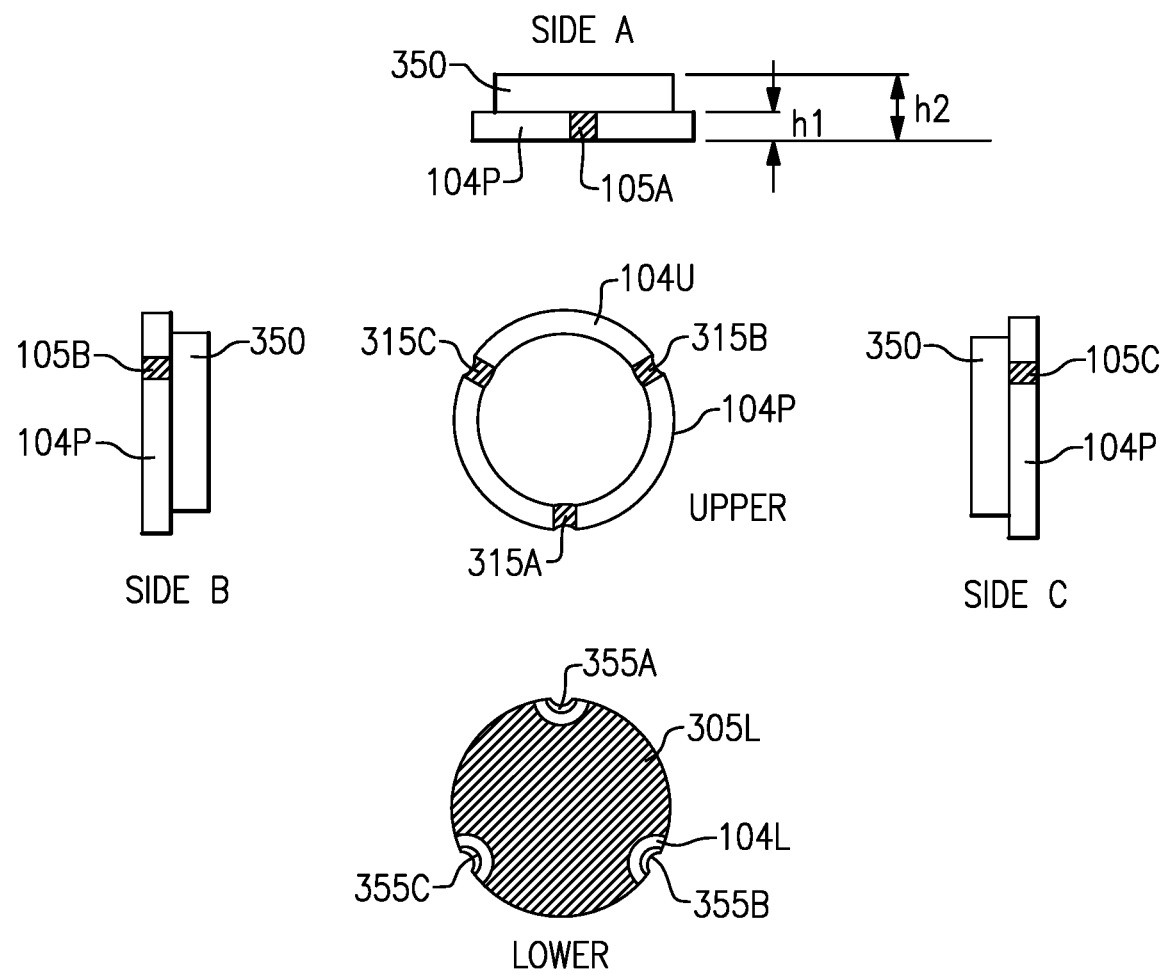
FIG. 5B illustrates an example of a microstrip circulator with a magnet covering the upper side metallization and ferrite disc from various sides.

FIGS. 5A and 5B further illustrate embodiments of a disc shaped circulator/isolator from the top, side, and bottom. FIG. 5B includes the magnet 350, while FIG. 5A omits the magnet 350 to illustrate the pattern of the top side metallization 305. FIG. 5A illustrates an alternative pattern of metallization 305 forming the metal disc on the upper side 104U of the dielectric substrate on top of the ferrite material disc (not visible) in which alternately shaped cutouts 325 are defined. The cutouts 325 in the example of FIG. 5A include a pair of slots between each port of the circulator defined by conductive traces 315A, 315B, and 315C. The lower side 104U of the dielectric substrate includes a metallization layer 305L that may, for example, be used as a ground plane. Three surface mount contacts 355A, 355B, 355C are also formed by metallization on the lower side 104L of the dielectric substrate. The surface mount contacts 355A, 355B, 355C are separated from the lower side metallization layer by gaps in the metallization to avoid short circuits. Metallization strips or vias 105A, 105B, 105C are disposed on different areas of the periphery 104P of the dielectric substrate and electrically connect the conductive traces 315A, 315B, and 315C to the respective surface mount contacts 355A, 355B, 355C. The metallization strips or vias 105A, 105B, 105C, in combination with the conductive traces 315A, 315B, and 315C form an impedance transformed for the circulator/isolator. As illustrated in FIG. 5B, the dielectric substrate may have a height h1 of, for example, about 1.25 mm and the magnet 350 may have a height of about 1.75 mm, giving the entire circulator/isolator assembly a height h2 of, for example, about 3 mm. The dielectric substrate may have a diameter of, for example, about 10 mm. It is to be understood that these dimensions are examples and are not intended to limit the embodiments disclosed herein.

Once the composite dielectric substrate/ferrite disc structure is formed, other components can be added onto the substrate. One or more components may be printed on the upper side 104U of the dielectric substrate, for example, a coupler or microstrip filter (e.g., coupler 330 illustrated in FIG. 3A). Antennas, amplifiers (e.g., semiconductor-based amplifiers), can be integrated onto the assembly as well. Others may be mounted in packaged form onto the substrate, for example a packaged BAW or SAW filter or packaged amplifier.

Thus, embodiments of the disclosure can form an integrated solution which can include a directional coupler and/or isolator in a package size which is comparable to a standard isolator, depending on the type of component. In some embodiments, the disclosed circulator will be no larger (and depending on the ferrite/dielectric combination chosen could be smaller) than all current ferrite microstrip circulators. In some embodiments, the disclosed assembly can be 100%, 95%, 90%, 85%, or 80% of the dimensions as compared to a typical circulator/isolator assembly. In some embodiments, the disclosed assembly can be less than 100%, 95%, 90%, 85%, or 80% of the dimensions as compared to a typical assembly. In some embodiments, the disclosed assembly can be greater than 95%, 90%, 85%, or 80% of the dimensions as compared to a typical assembly which does not use co-firing process.

5G Applications

Embodiments of the disclosed composite microstrip circulators/isolators can be particularly advantageous for 5th generation wireless system (5G) applications, though could also be used for early 4G and 3G applications as well. 5G technology is also referred to herein as 5G New Radio (NR). 5G networks can provide for significantly higher capacities than current 4G systems, which allows for a larger number of consumers in an area. This can further improve uploading/downloading limits and requirements. In particular, the large number of microstrip circulators/isolators and substrate integrated waveguide (SIW) circulators/isolators, such as those described herein, needed for 5G (typically 1 per front end module or FEM) requires further integration of components. The disclosed embodiments of microstrip circulators/isolators can allow for this integration and thus can be particularly advantageous. Other components in the front end module will be microstrip or SMT based.

Preliminary specifications for 5G NR support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Figure 6:
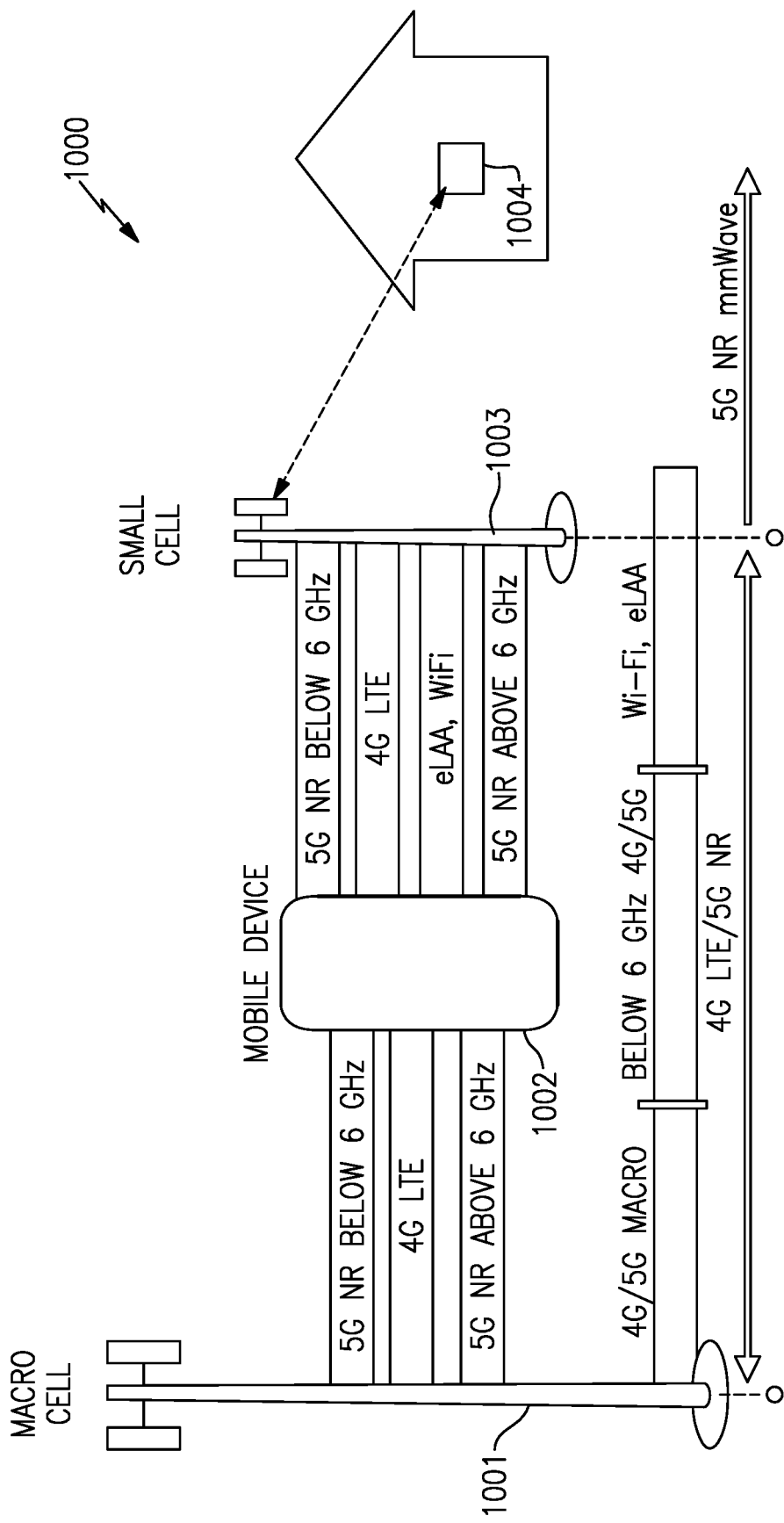
FIG. 6 is a schematic diagram of one example of a communication network.

FIG. 6 is a schematic diagram of one example of a communication network 1000. The communication network 1000 includes a macro cell base station 1001, a mobile device 1002, a small cell base station 1003, and a stationary wireless device 1004.

The illustrated communication network 1000 of FIG. 6 supports communications using a variety of technologies, including, for example, 4G LTE, 5G NR, and wireless local area network (WLAN), such as Wi-Fi. Although various examples of supported communication technologies are shown, the communication network 1000 can be adapted to support a wide variety of communication technologies.

Various communication links of the communication network 1000 have been depicted in FIG. 6. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

As shown in FIG. 6, the mobile device 1002 communicates with the macro cell base station 1001 over a communication link that uses a combination of 4G LTE and 5G NR technologies. The mobile device 1002 also communicates with the small cell base station 1003 which can include embodiments of the disclosure. In the illustrated example, the mobile device 1002 and small cell base station 1003 communicate over a communication link that uses 5G NR, 4G LTE, and Wi-Fi technologies.

In certain implementations, the mobile device 1002 communicates with the macro cell base station 1001 and the small cell base station 1003 using 5G NR technology over one or more frequency bands that are less than 6 Gigahertz (GHz). In one embodiment, the mobile device 1002 supports a HPUE power class specification.

The illustrated small cell base station 1003, incorporating embodiments of the disclosure, also communicates with a stationary wireless device 1004. The small cell base station 1003 can be used, for example, to provide broadband service using 5G NR technology over one or more frequency bands above 6 GHz, including, for example, millimeter wave bands in the frequency range of 30 GHz to 300 GHz.

In certain implementations, the small cell base station 1003 communicates with the stationary wireless device 1004 using beamforming. For example, beamforming can be used to focus signal strength to overcome path losses, such as high loss associated with communicating over millimeter wave frequencies.

The communication network 1000 of FIG. 6 includes the macro cell base station 1001, which can include embodiments of the disclosure (such as the microstrip circulators/isolators), and the small cell base station 1003. In certain implementations, the small cell base station 1003 can operate with relatively lower power, shorter range, and/or with fewer concurrent users relative to the macro cell base station 1001. The small cell base station 1003 can also be referred to as a femtocell, a picocell, or a microcell.

Although the communication network 1000 is illustrated as including two base stations, the communication network 1000 can be implemented to include more or fewer base stations and/or base stations of other types.

Figure 7:
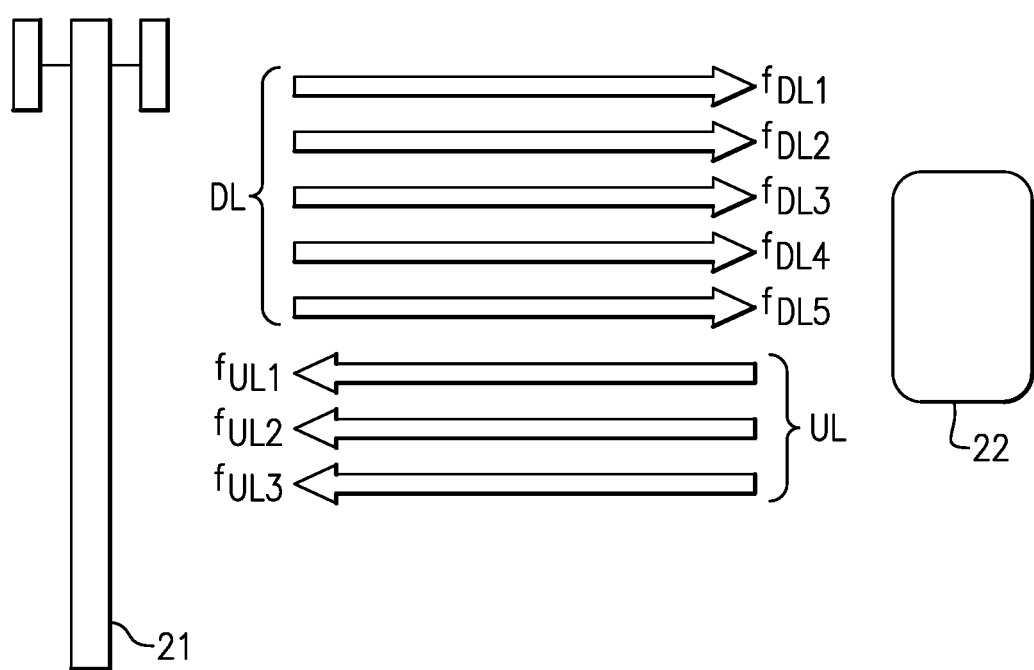
FIG. 7 is a schematic diagram of one example of a communication link using carrier aggregation.

The communication network 1000 of FIG. 7 is illustrated as including one mobile device and one stationary wireless device. The mobile device 1002 and the stationary wireless device 1004 illustrate two examples of user devices or user equipment (UE). Although the communication network 1000 is illustrated as including two user devices, the communication network 1000 can be used to communicate with more or fewer user devices and/or user devices of other types. For example, user devices can include mobile phones, tablets, laptops, IoT devices, wearable electronics, and/or a wide variety of other communications devices.

User devices of the communication network 1000 can share available network resources (for instance, available frequency spectrum) in a wide variety of ways.

Enhanced mobile broadband (eMBB) refers to technology for growing system capacity of LTE networks. For example, eMBB can refer to communications with a peak data rate of at least 10 Gbps and a minimum of 100 Mbps for each user device. Ultra-reliable low latency communications (uRLLC) refers to technology for communication with very low latency, for instance, less than 2 ms. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 1000 of FIG. 6 can be used to support a wide variety of advanced communication features, including, but not limited to eMBB, uRLLC, and/or mMTC.

A peak data rate of a communication link (for instance, between a base station and a user device) depends on a variety of factors. For example, peak data rate can be affected by channel bandwidth, modulation order, a number of component carriers, and/or a number of antennas used for communications.

For instance, in certain implementations, a data rate of a communication link can be about equal to $M*B*\log_2(1+S/N)$, where M is the number of communication channels, B is the channel bandwidth, and S/N is the signal-to-noise ratio (SNR).

Accordingly, data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing data rate and/or communication performance.

FIG. 7 is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 7 the communications link includes a downlink channel used for RF communications from the base station 21 to the mobile device 22, and an uplink channel used for RF communications from the mobile device 22 to the base station 21.

Although FIG. 7 illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 7, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

With reference to FIG. 7, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Figure 8A:
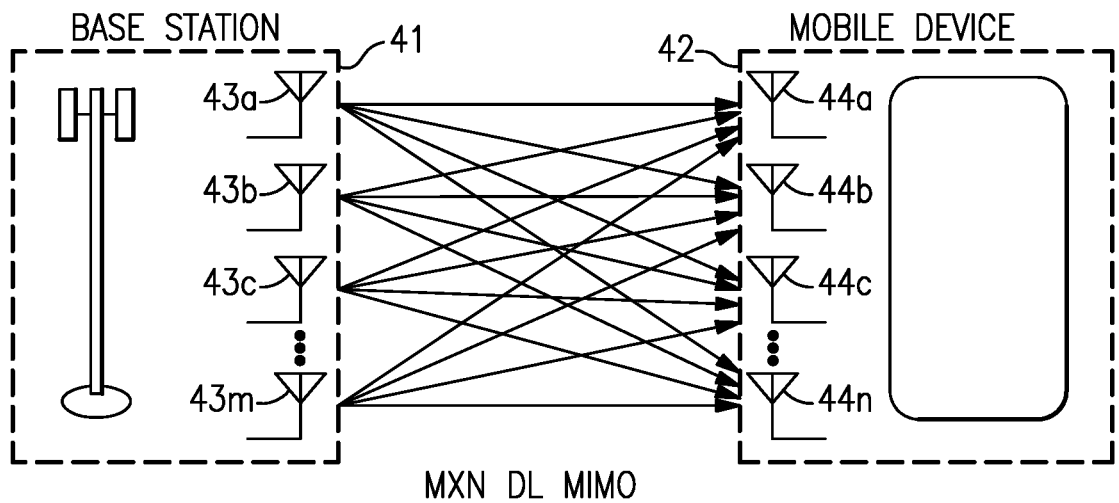
FIG. 8A is a schematic diagram of one example of a downlink channel using multi-input and multi-output (MIMO) communications.
Figure 8B:
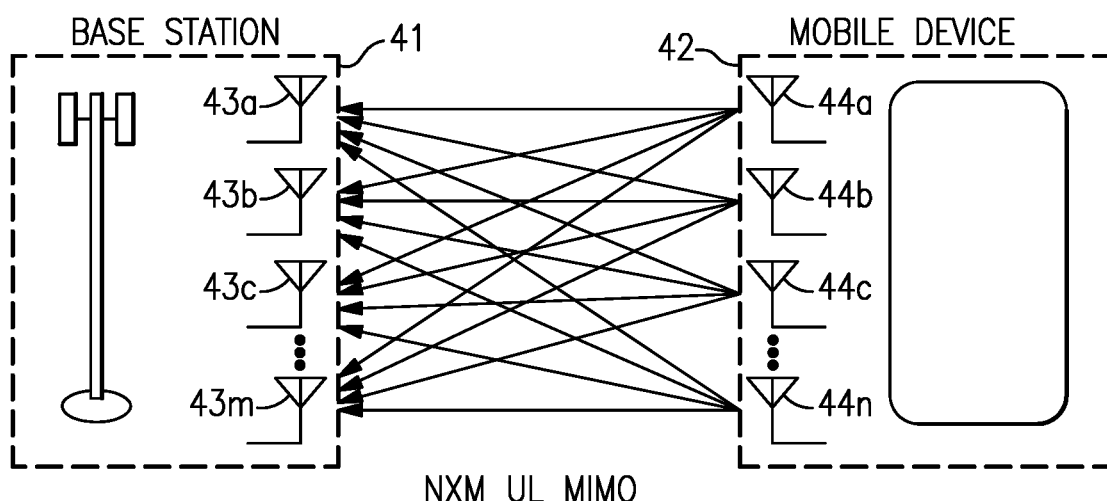
FIG. 8B is schematic diagram of one example of an uplink channel using MIMO communications.

FIG. 8A is a schematic diagram of one example of a downlink channel using multi-input and multi-output (MIMO) communications. FIG. 8B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 8A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 8A illustrates an example of M×N DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 8B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 8B illustrates an example of N×M UL MIMO.

By increasing the level or order of MIMO, bandwidth of an uplink channel and/or a downlink channel can be increased.

Although illustrated in the context of FDD, MIMO communications are also applicable communication links using TDD.

For these 5G networks, one form of base station will be massive multiple input, multiple output (MIMO) based, with an array of perhaps 64-128 antennas capable of multi-beam forming to interact with handheld terminals at very high data rates. Thus, embodiments of the disclosure can be incorporated into the base stations to provide for high capacity applications.

This approach is similar to radar phased array T/R modules, with individual transceivers for each antenna element, although massive MIMO is not a phased array in the radar sense. The objective is optimum coherent signal strength at the terminal(s) rather than direction finding. Further, signal separation will be time division (TD) based, requiring a means of duplexing/switching to separate Tx and Rx signals For discussion, it is assumed that there is one Tx, one Rx module, one duplexing circulator and one antenna filter per antenna. However, other configurations can be used as well.

FIG. 6 shows a simplified version of an RF transmission system, omitting drivers and switching logic. As shown, the system can include a number of different components, including microstrip circulators/isolators. Thus, embodiments of the disclosure can be used as the microstrip circulators/isolators in the RF system, either for newly created systems or as improved replacements for the previous systems.

Figure 9:
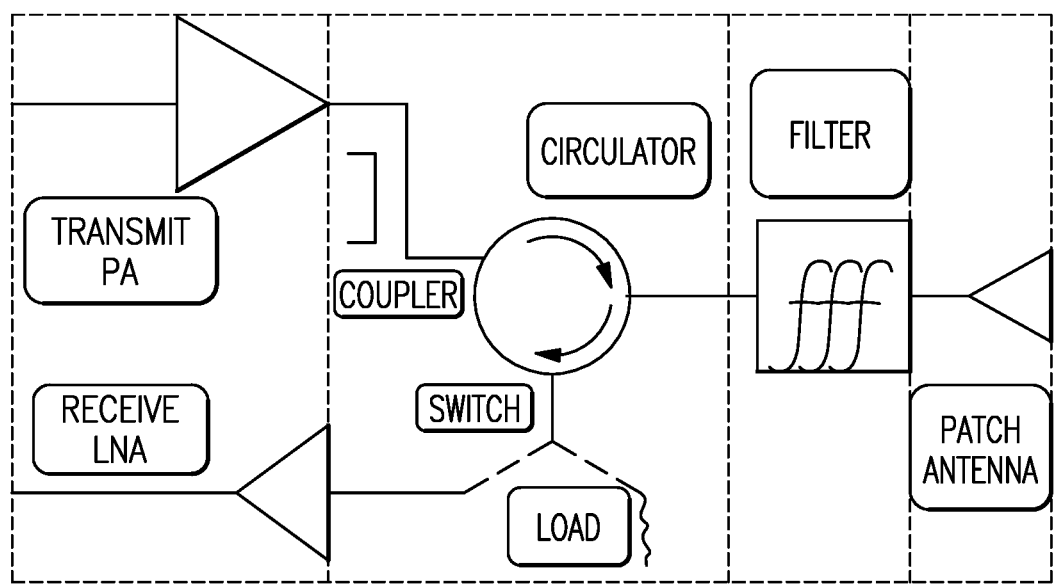
FIG. 9 illustrates a schematic of an antenna system.

FIG. 9 illustrates the integrated component of FIG. 4A, 4B discussed above onto the simplified RF antenna structure. As shown, the substrate can include the co-fired microstrip circulators/isolators disclosed herein. In addition, a coupler, switch, and load can also be applied to the dielectric tile outside of the ferrite. The conductors and the ground plane could be in a thick film silver. In some embodiments, the circulator subassembly can also be integrated with the power amplifier (PA) and low noise amplifier (LNA) modules.

Embodiments of the disclosed microstrip circulators/isolators can have advantages over circulators known in the art. For example:

Couplers and other transmission lines have much lower insertion loss compared with other couplers, such as semiconductor couplers.

Coupling is more consistent.

Loads can dissipate heat more easily compared with soft substrate.

Circulators have lower loss than all-ferrite substrate-based devices.

The dielectric is temperature stable, assisting the coupler and circulator's performance.

The size of the devices can be reduced by using higher dielectric constant ceramic dielectric if required.

Further, embodiments of the microstrip circulators/isolators can have the following advantages:

Heat/power dissipation/thermal conductivity for PA and load.

Isotropic dielectric (except TTB) for coupler/filter design.

Range of dielectric constant (4-100+) for size reduction.

Low dielectric loss (coupler/filter).

Tight dielectric constant tolerance (coupler/filter/antenna)

Stable dielectric constant over temperature (coupler/filter/circulator).

Modest Cost

On the other hand, soft substrate (e.g., softboards) can have the following disadvantages:

Poor conductivity due to plastic conductivity.

Anisotropic (xy versus z direction).

Only 3-10 with some, fixed with others.

Higher losses.

Looser tolerances.

Unstable over temperature.

Accordingly, embodiments of the disclosed microstrip circulators/isolators can have significant advantages over circulators previously known in the art.

Figure 10:
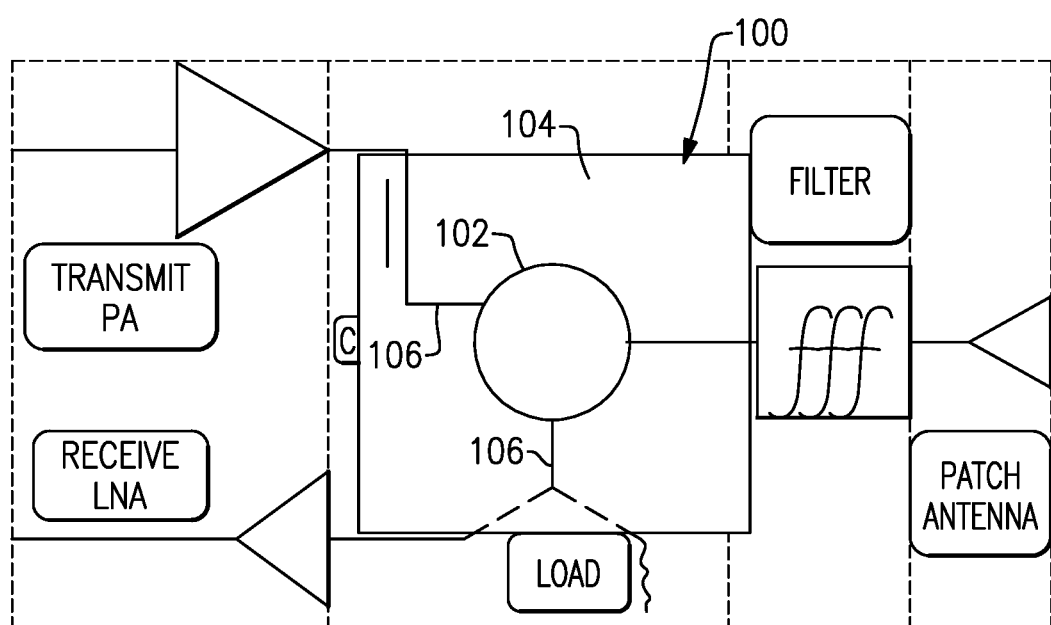
FIG. 10 illustrates a schematic of an antenna system with an embodiment of an integrated microstrip circulator.
Figure 11:
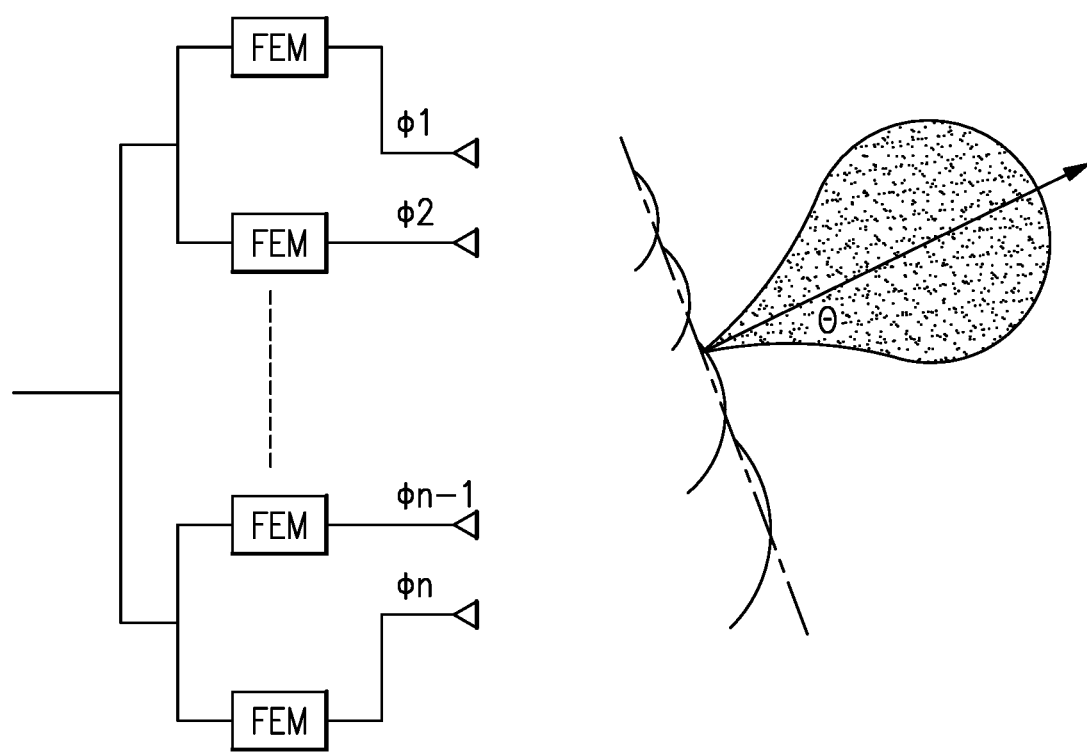
FIG. 11 illustrates a MIMO system incorporating embodiments of the disclosure.

FIG. 11 illustrates another embodiment of a MIMO system that the disclosed microstrip circulators/isolators can be incorporated into. With the advent of massive MIMO for 5G system the current antennas will be replaced with antenna arrays with, for example, 64 array elements. Each element can be fed by a separate front end module (FEM) including the blocks shown in FIGS. 9 and 10 in which embodiments of the microstrip circulator formed on the co-fired tile can be an integral component.

Figure 12:
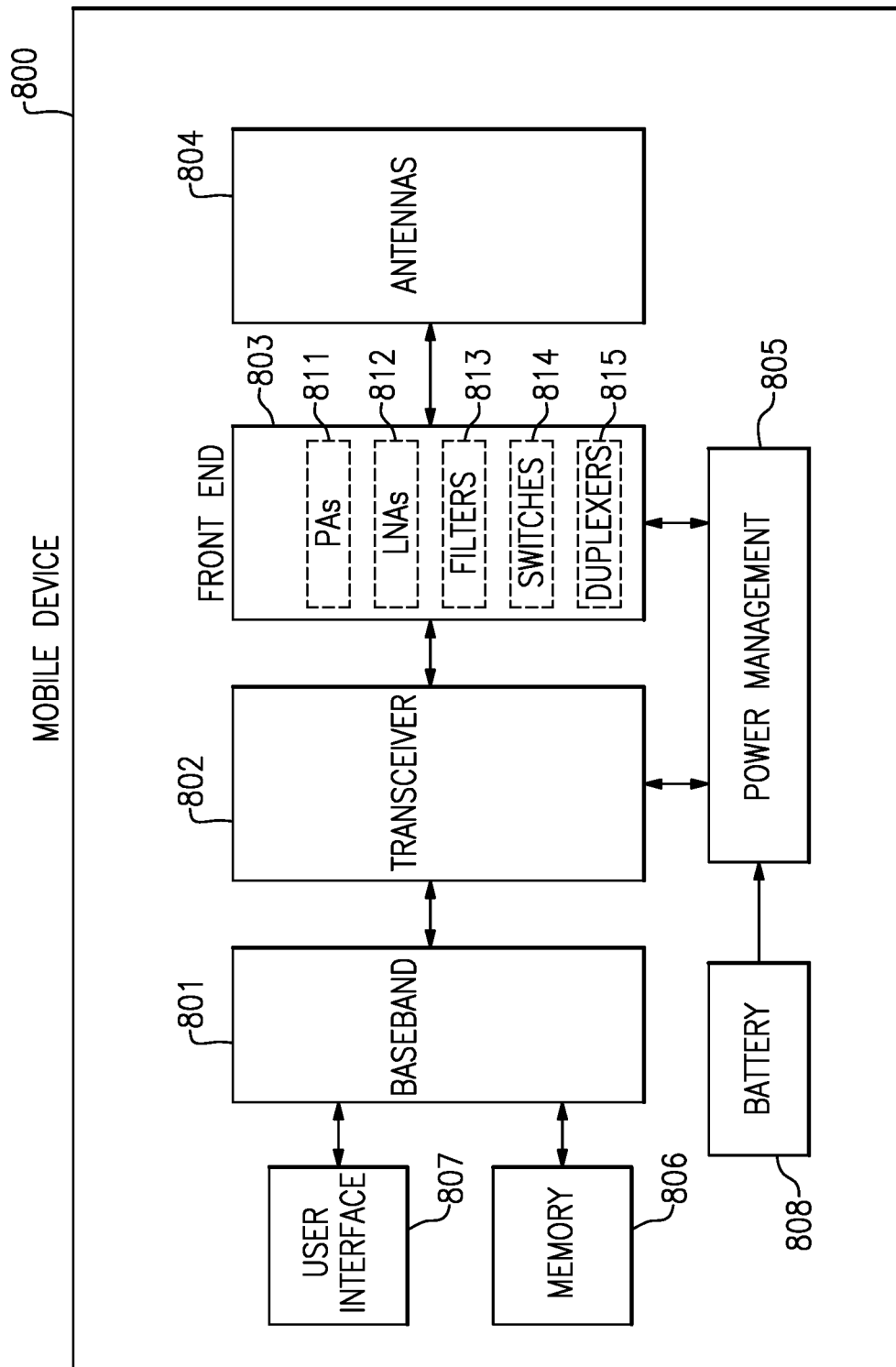
FIG. 12 is a schematic diagram of one example of a mobile device.

FIG. 12 is a schematic diagram of one example of a mobile device 800. The mobile device 800 includes a baseband system 801, a transceiver 802, a front end system 803, antennas 804, a power management system 805, a memory 806, a user interface 807, and a battery 808 and can interact with the base stations including embodiments of the microstrip circulators disclosed herein.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 12 as the transceiver 802. In one example, separate components (for instance, separate circuits or dies) can be provided for handling certain types of RF signals.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas associated transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel.

MIMO communications benefit from higher signal to noise ratio, improved coding, and/or reduced signal interference due to spatial multiplexing differences of the radio environment.

Switched diversity refers to communications in which a particular antenna is selected for operation at a particular time. For example, a switch can be used to select a particular antenna from a group of antennas based on a variety of factors, such as an observed bit error rate and/or a signal strength indicator.

Figure 13:
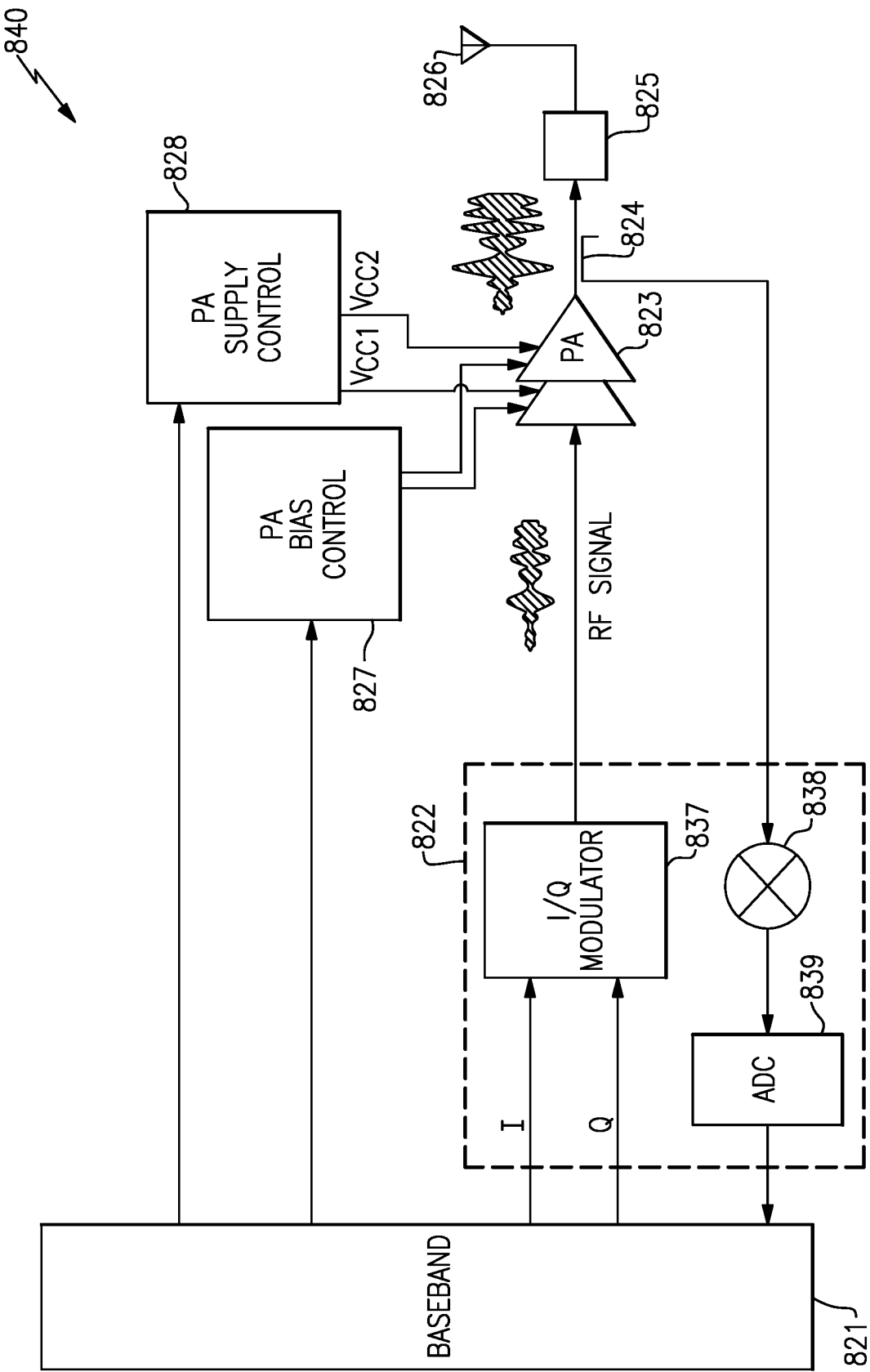
FIG. 13 is a schematic diagram of a power amplifier system according to one embodiment.

FIG. 13 is a schematic diagram of a power amplifier system 840 according to one embodiment. The illustrated power amplifier system 840 includes a baseband processor 821, a transmitter 822, a power amplifier (PA) 823, a directional coupler 824, a bandpass filter 825, an antenna 826, a PA bias control circuit 827, and a PA supply control circuit 828. The illustrated transmitter 822 includes an I/Q modulator 837, a mixer 838, and an analog-to-digital converter (ADC) 839. In certain implementations, the transmitter 822 is included in a transceiver such that both transmit and receive functionality is provided. Embodiments of the disclosed microstrip circulators/isolators and SIW circulators/isolators can be incorporated into the power amplifier system.

Methodology

Figure 14:
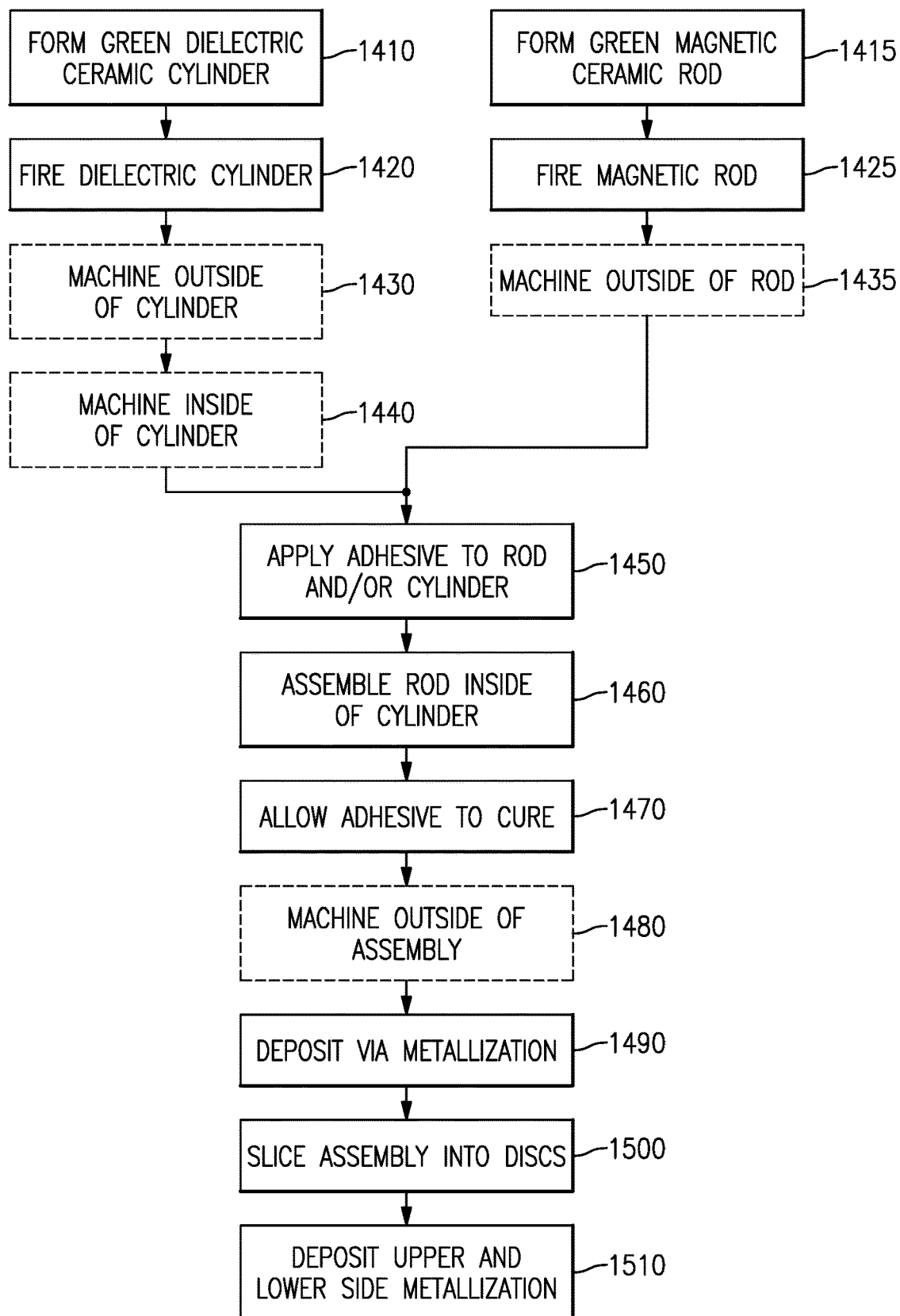
FIG. 14 illustrates a method of forming a composite integrated microstrip circulator.

Disclosed herein are embodiments of a process for making microstrip circulators/isolators and SIW circulators/isolators. FIG. 14 discloses an embodiment of a process that can be used.

At step 1410 of FIG. 14, an annular cylinder, for example, as illustrated in 3B, or a prismatic shaped dielectric substrate as illustrated in FIG. 3A is formed from a dielectric ceramic by, for example, filling an appropriately sized mold with hydrated precursors of the dielectric ceramic material, followed by pressing and drying of the material using a suitable metal die set and a hydraulic press. The remainder of the method will be described with reference to a cylindrical dielectric substrate, but is equally applicable to methods involving a prismatic shaped dielectric substrate. In some aspects, a pressure in a range of between about 500 psi and about 5000 psi may be used to press the material. This dielectric ceramic material may be any dielectric ceramic material that may be used in the construction of magnetic-dielectric composite assemblies, such as, but not limited to, a ceramic material having the composition $MgO$—$CaO$—$ZnO$—$Al_2O_3$—$TiO_2$ or any of the dielectric materials disclosed above. In some embodiments, grooves or recesses, such as recesses 320 illustrated in FIG. 4A for external via metallization 105 may be formed in a perimeter of the dielectric material cylinder in step 1410.

At step 1420, the unfired or "green" cylinder is then fired. The firing step may include sintering of the ceramic material. This firing step may take place in any suitable firing apparatus, such as, but not limited to, a high temperature oven or a kiln. The temperature ramp rate, the soak temperature, and the time for which the cylinder is fired may be chosen depending on the requirements for a particular application. For example, if small crystal grains are desired in the material after firing, a faster temperature ramp, and/or lower soak temperature, and/or shorter firing time may be selected as opposed to an application where larger crystal grains are desired. In addition, the use of different amounts and/or forms and/or particle sizes of precursor materials may result in different requirements for parameters such as temperature ramp rate and soaking temperature and/or time to provide desired characteristics to the post-heated cylinder. Sintering of the cylinder may be performed at a suitable or desired temperature and for a time period sufficient to provide one or more desired characteristics, such as, but not limited to, crystal grain size, level of impurities, compressibility, tensile strength, density, or porosity. For example, a material having the composition $MgO$—$CaO$—$ZnO$—$Al_2O_3$—$TiO_2$ may be fired at a temperature of about 1310° C. for a time period of between about two and about 12 hours, and in one aspect for about six hours.

At step 1430, the outside surface of the cylinder may be machined to a desired outside diameter and/or desired degree of circularity and/or a desired smoothness. At step 1440, the inside surface of the cylinder may similarly be machined to a desired inside diameter and/or desired degree of circularity and/or a desired smoothness. In some embodiments, it may be desirable to impart a similar degree or circularity and/or smoothness to both outside surface and inside surface to, for example, facilitate the centering of a rod within the cylinder. In other embodiments, it may be desirable to impart a different degree or circularity and/or smoothness to outside surface and inside surface to, for example, accommodate applications calling for a non-circular external surface, or to facilitate adhesion of an object to external surface or to internal surface. The preferred dimensions for the rod depend on the application, but in some aspects are in the range from about 10 mm to about 40 mm in diameter, and from about 15 mm to about 40 mm in length. The tube inside diameter and length may correspond to the rod diameter and length, with a wall thickness of up to about 5 mm in some aspects. It should be appreciated that steps 1430 and 1440 may be performed in the reverse order or combined as a single step.

At step 1415, a rod formed from a magnetic ceramic material using, for example, a method such as is described in U.S. Pat. No. 8,524,190, titled "Enhanced Hexagonal Ferrite Material and Methods of Preparation and Use Thereof," incorporated herein by reference in its entirety for all purposes. The rod may be formed from any suitable magnetic ceramic material, such as yttrium-iron-garnet (YIG), or any other suitable ferrimagnetic garnets, spinels, or ceramic ferrites disclosed above.

At step 1425, the unfired or "green" rod is then fired. The firing step may include sintering of the ceramic material. This firing step may take place in any suitable firing apparatus, such as, for example, a high temperature oven or a kiln. The firing temperature and duration may vary for a particular application depending on factors similar to those discussed above with regard to the ceramic cylinder, such as, but not limited to, the type of material selected, desired porosity, the form and/or size of precursor material particles, if any, that are used, the desired grain size, and the desired density. For example, a YIG material may be fired at a temperature in a range of from about 1300° C. to about 1500° C., e.g., 1310° C., for a time period of between about two and about twelve hours, and in some aspects for about eight hours. Some of the above listed factors may also vary as a result of the pressure at which the pre-fired rod may have been pressed in step 1415. For example, if a green YIG rod is pressed at a pressure of about 5000 psi before firing, it would have a lower porosity after firing than if it had been pressed at about 500 psi before firing.

At step 1435, the outer or outside surface of the rod may be machined to a desired diameter, degree of circularity, and smoothness. In some aspects, all dimensions are measured using standard micrometers with an accuracy of about 0.0025 mm in dimensions. In some aspects, surface roughness is measured by comparison to standard surfaces, with a surface roughness in the range from about 0.1 micrometers to about 1 micrometer. The degree of circularity of the outer surface of the rod may be similar to that of the inside surface of annular cylinder in order to, for example, facilitate centering of rod within annular cylinder. The degree of circularity of the outer surface of the rod may be similar to that of the inside surface of annular cylinder in order to, for example, facilitate centering of the rod within the annular cylinder. The degree of smoothness of the outer surface of the rod may be similar to or different from that of inside surface and/or outside surface of the annular cylinder depending upon, for example, the type of adhesive that might be used to secure the rod inside the cylinder and how surface roughness affects the strength of adhesion for that adhesive. The diameter of the rod may be slightly smaller, for example, between 0 mm and 0.025 mm less than the inside diameter of the annular cylinder so that the rod can be fitted within the cylinder, as described below, to give a close fit. Both the outer surface of the rod and the inside surface of the cylinder may be machined to precise tolerances, in some aspects with a tolerance of about 0.005 mm, measured using suitable micrometers, in order to promote adhesion between the rod and cylinder and to facilitate coaxially centering and aligning the rod within the cylinder. This will also facilitate concentricity of the assembly. In some aspects, the surfaces of the tube and rod are cleaned ultrasonically in a suitable medium prior to assembly.

At step 1450, an adhesive is applied to at least a portion of one or both of the outer surface of the rod and the inside surface of the annular cylinder using a suitable adhesive dispenser or syringe. The adhesive may be one of the inorganic adhesives discussed above.

At step 1460, the rod is inserted inside the annular cylinder to form a rod-and-cylinder assembly, such as the magnetic-dielectric rod-and-cylinder assembly 100' illustrated in FIG. 3C. A gap may exist between the outer surface of the rod and the inner surface of the annular cylinder which may be filled with adhesive upon the insertion of the rod into the cylinder. The width of gap may be, for example, about 10 microns or greater.

The adhesive is allowed to cure (harden), as indicated by step 1470. In some aspects, heat may be applied in the form of, for example, hot air to the magnetic-dielectric rod-and-cylinder assembly to facilitate the curing of the adhesive. In some aspects a cure time is about 5 minutes. At step 1480, the outside surface of the magnetic-dielectric rod-and-cylinder assembly may be again machined to a desired diameter and/or smoothness and/or degree of circularity. It should be noted that in some methods, step 1430 may be performed along with, or in place of step 1480 at this point on the cured rod-and-cylinder assembly, rather than earlier in the process.

In step 1490, external metallization strips or vias, for example metallization strips or vias 105 illustrated in FIGS. 3F, 4A, 5A, and 5B may be formed on the perimeter of the magnetic-dielectric rod-and-cylinder assembly. The metallization strips or vias 105 may provide electrical connection between the ports of the to-be-formed circulator/isolator and lower side surface mount contacts (e.g., contacts 355A, 355B, 355C in FIGS. 5A and 5B) to facilitate surface mounting of a circulator/isolator formed from the magnetic-dielectric rod-and-cylinder assembly as described above.

At step 1500, the magnetic-dielectric rod-and-cylinder assembly may be cut into a number of disc assemblies 56, as are illustrated in FIG. 3D or plates 200 as illustrated in FIG. 3E. The magnetic-dielectric rod-and-cylinder assembly may be cut using a saw such as an annular inside diameter saw or an outside diameter saw, using diamond or silicon carbide impregnated blades, or may be cut in an alternate manner, such as by water jet or laser cutting.

At step 1510 the ferrite/dielectric assemblies are metallized by deposition of a suitable metal, for example, silver or copper on the upper and lower sides of the assemblies. The upper side metallization 305 may be used to define the metal disc 310 and conductive traces 315 that may couple different portions of the perimeter of the metal disc 310 to the strips of metallization 105. The upper side metallization 305 may be used to define additional circuit elements, for example a coupler 330 as illustrated in FIG. 4A on the upper side of the dielectric substrate. The lower side metallization 305U may be used to form, for example, a ground plane on the lower side of the ferrite/dielectric assemblies and the surface mount contacts 355A, 355B, 355C.

Subsequent to forming the ferrite/dielectric assemblies by a method such as that illustrated in FIG. 14, magnets may be attached atop the metal discs, for example, with an adhesive, optionally after deposition of a dielectric layer on the metal discs to help prevent short circuits, to complete the fabrication of circulators or isolators from the ferrite/dielectric assemblies. The individual circulators or isolators may be surface mounted to an external substrate, for example, a printed circuit board along with other devices by surface mount technologies known in the art, for example, by depositing bumps of solder on the surface mount contacts 355A, 355B, 355C and solder bonding the circulators or isolators to contacts o the external substrate. Alternatively, if the surface mount contacts 355A, 355B, 355C are formed of a suitable material, other surface mounting methods such as gold-gold bonding, ultrasonic welding, or other methods may be used to surface mount the individual circulators or isolators on the external substrate.

The description of the method above is not meant to be limiting. In some methods according to the present invention, some of the steps described above may be combined, performed in alternate order, or even eliminated. For example, in some aspects of the invention, one or more of the machining steps 1430, 1435, 1440, or 1480 may be eliminated if the as-formed rod and/or cylinder have surfaces of acceptable diameters and/or smoothness and/or degree of circularity, such as better than 1 micron surface finish and roundness of 0.025 mm, and diameters in the range 10 mm to 40 mm. Further, additional steps not explicitly described may be included in aspects of methods according to the present invention. For example, additional machining or polishing steps may be included if a magnetic-dielectric assembly shaped other than as a flat disc is desired.

In some embodiments, additional components can be added onto the dielectric substrate, such as circuitry (e.g., metalized circuitry), to form final electronic components.

EXAMPLES

Figure 15:
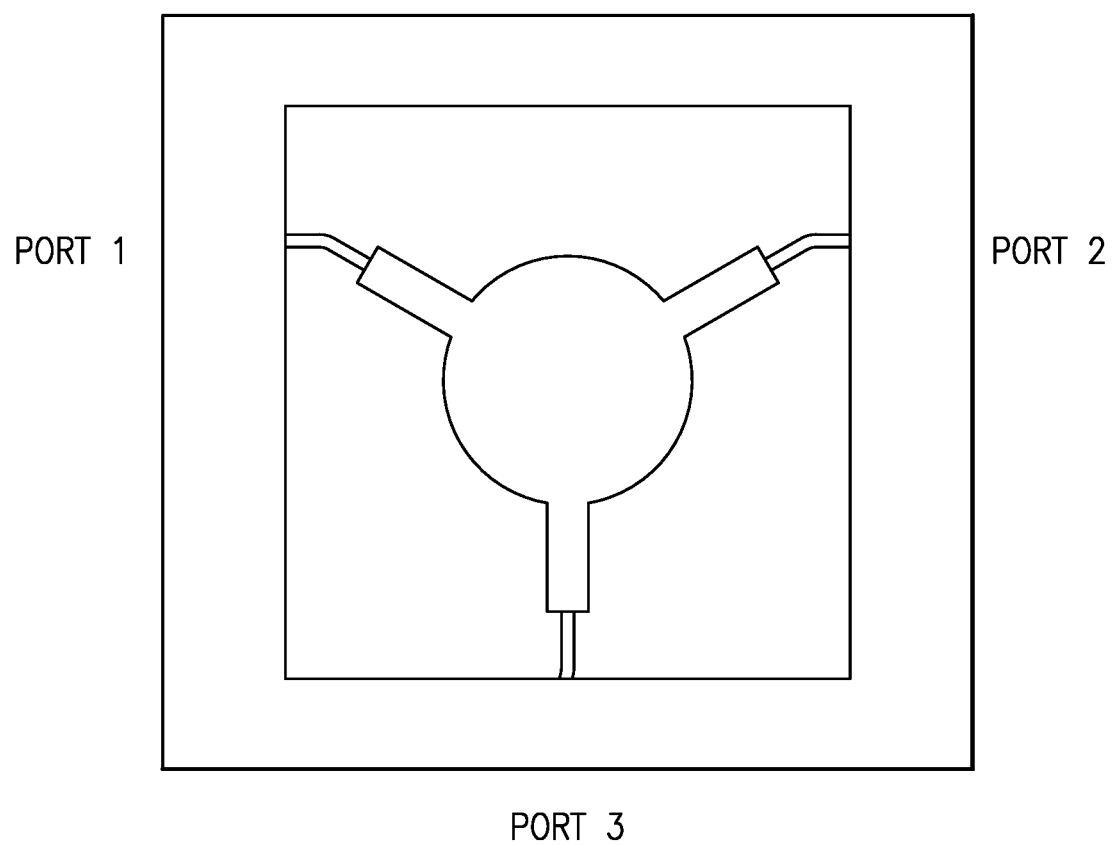
FIG. 15 illustrates an embodiment of an integrated microstrip circulator for testing.

FIG. 15 schematically illustrates an example embodiment of a circulator as discussed herein, for example, as illustrated in further detail in FIGS. 4A-5B. Thick film silver can be printed as the circuit. As per standard circulator applications, the circulator includes three port, designated Port 1, Port 2, and Port 3. One of these ports can be terminated to form an isolator.

FIGS. 16A-16D illustrate performance characteristics as a function of frequency and temperature for a circulator formed in accordance with the present disclosure. The device used to generate the data is as per FIG. 5, the ferrite diameter is 8 mm, the dielectric diameter is 10.2 mm, the ferrite/dielectric assembly height is 1.25 mm and the overall part height is 3 mm. The ferrite material is TTHiE-1000 and the dielectric material is MCT-25.

Figure 16A:
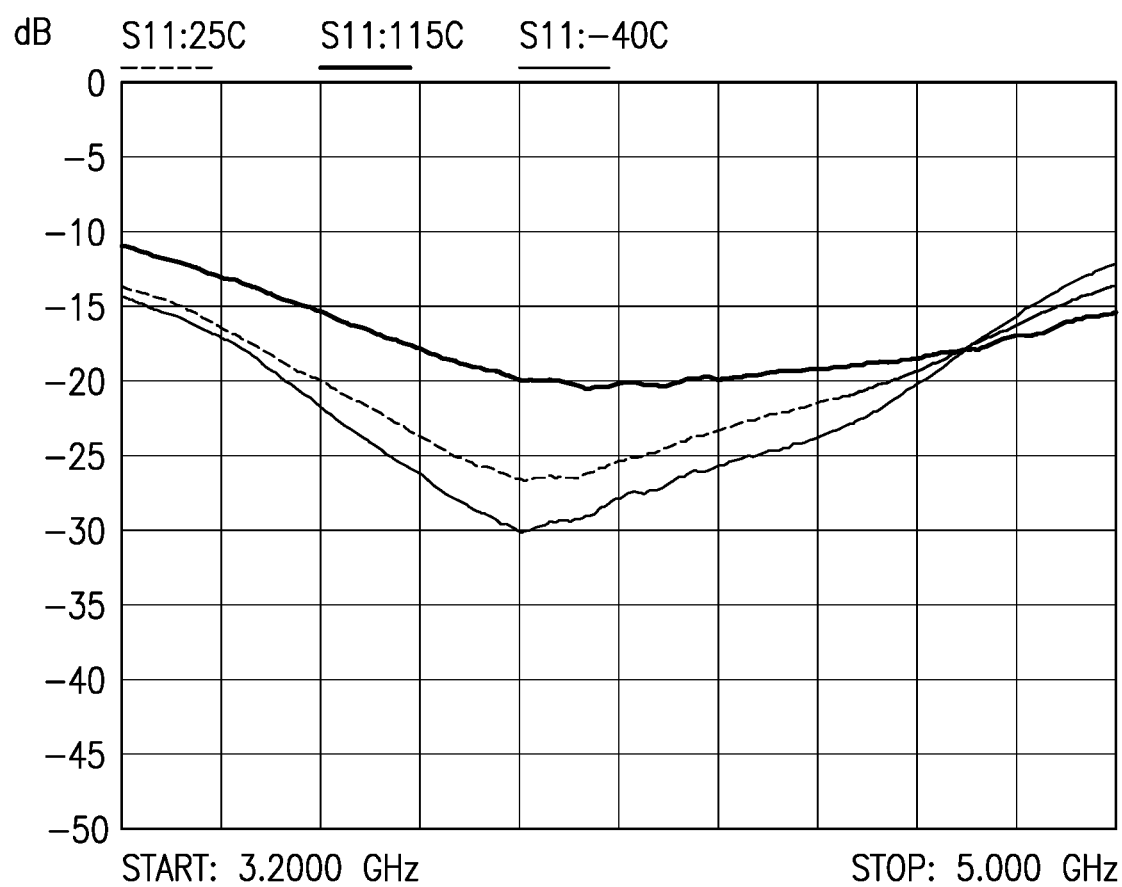
FIGS. 16A-16D illustrate performance characteristics as a function of frequency and temperature for a circulator formed in accordance with the present disclosure.

FIG. 16A shows input return loss at −40° C., 25° C., and 115° C. across frequencies ranging from 3.2 GHz to 4.2 GHz. Performance is >24 dB at room and cold temperatures, reducing to >18 dB at 115° C.

Figure 16B:
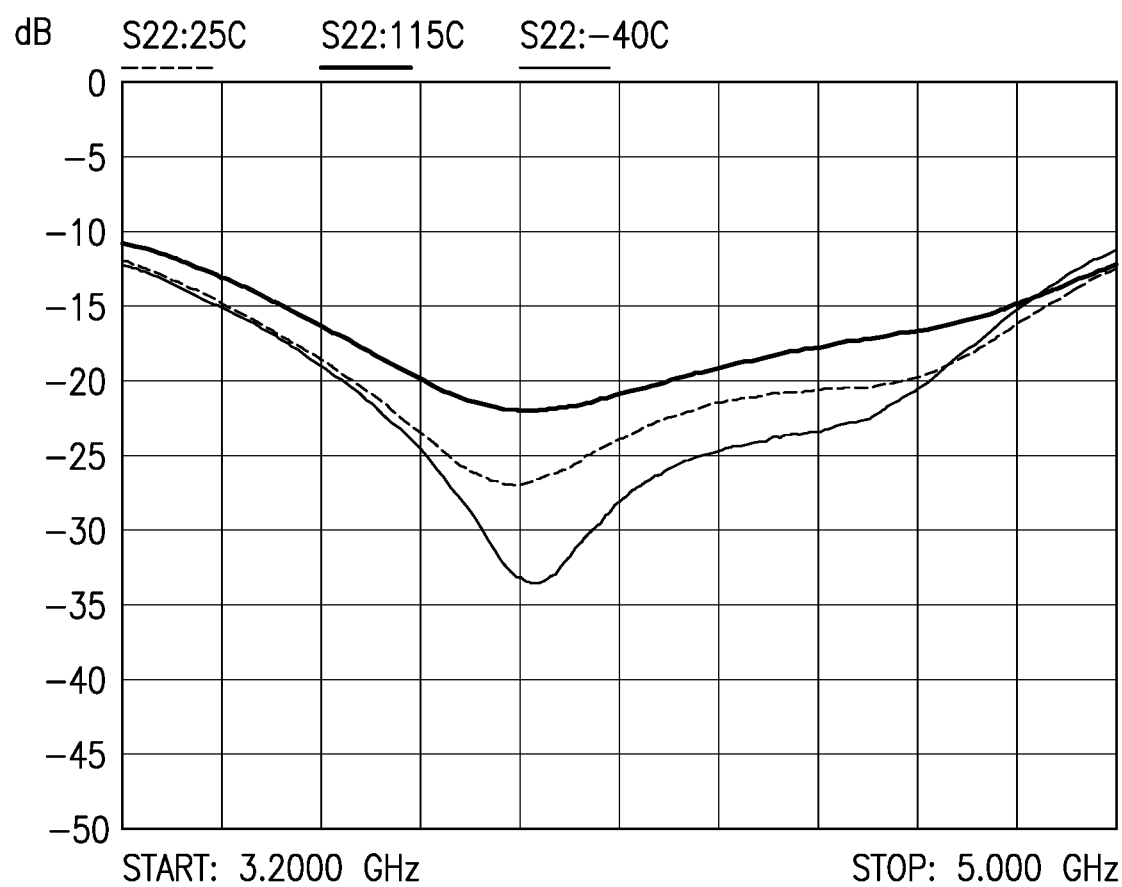

FIG. 16B shows output return loss at −40° C., 25° C., and 115° C. across frequencies ranging from 3.2 GHz to 4.2 GHz. Performance is >24 dB at room and cold temperatures, reducing to >18 dB at 115° C.

Figure 16C:
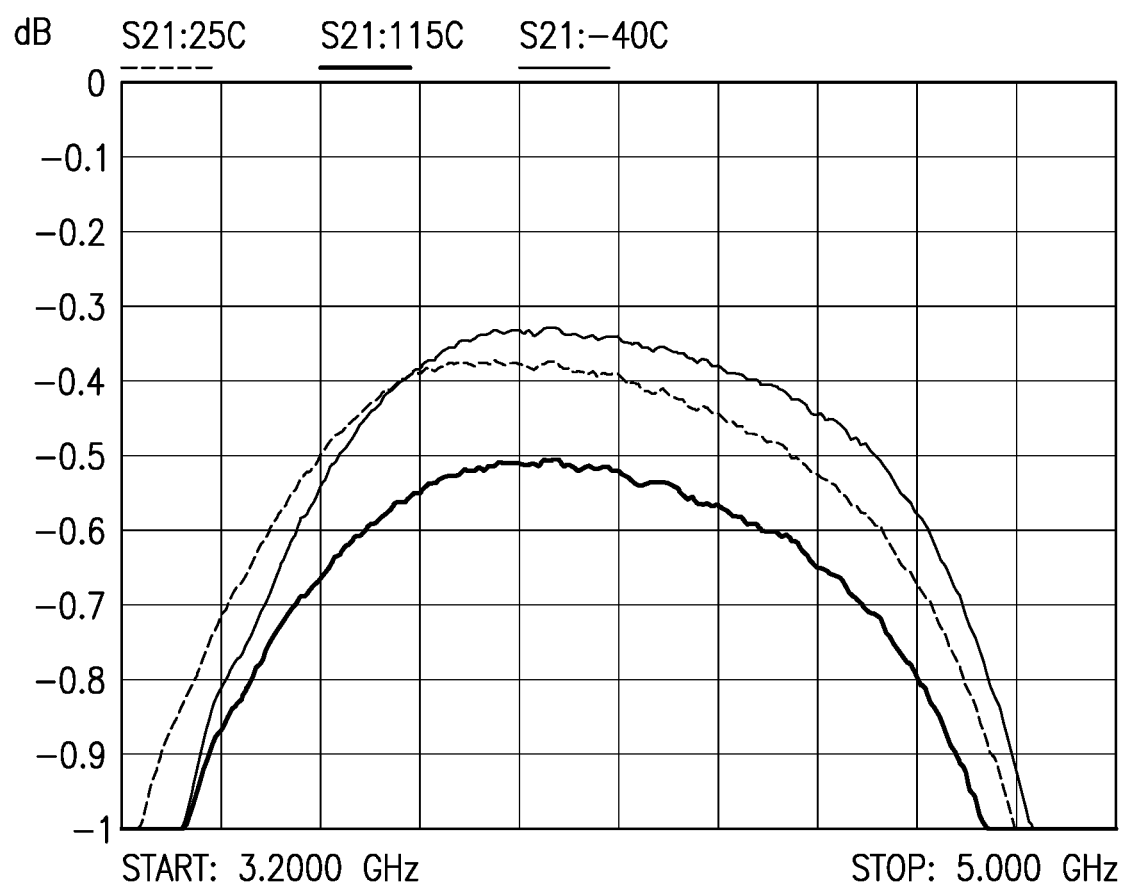

FIG. 16C shows insertion loss at −40° C., 25° C., and 115° C. across frequencies ranging from 3.2 GHz to 4.2 GHz. Performance is <0.45 dB at room and cold temperature, reducing to <0.55 dB at 115° C.

Figure 16D:
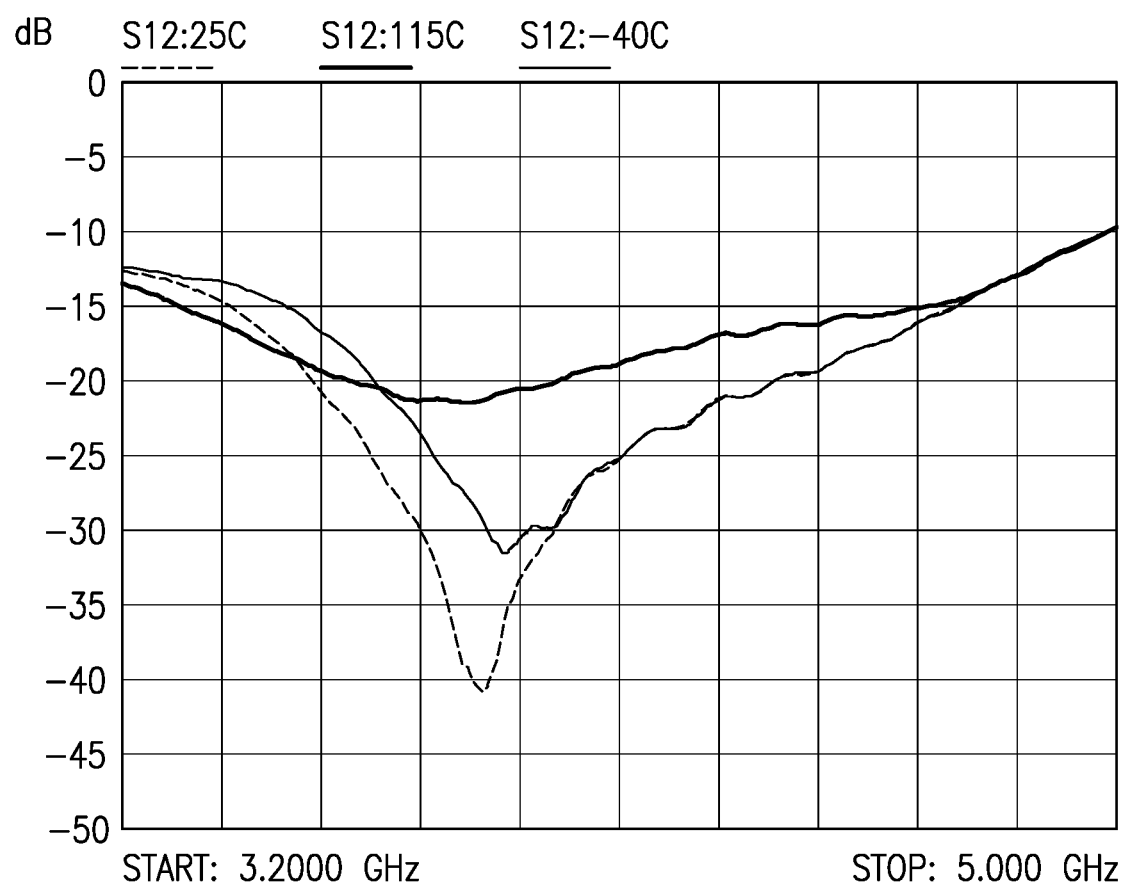

FIG. 16D shows isolation (the reverse transmission through the circulator, this is preferably a high-dB value) at −40° C., 25° C., and 115° C. across frequencies ranging from 3.2 GHz to 4.2 GHz. Performance is >23 dB at room and cold temperature, reducing to >17.5 dB at 115° C.

From the foregoing description, it will be appreciated that inventive products and approaches for composite microstrip circulators/isolators are disclosed. While several components, techniques and aspects have been described with a certain degree of particularity, it is manifest that many changes can be made in the specific designs, constructions and methodology herein above described without departing from the spirit and scope of this disclosure.

Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as any subcombination or variation of any subcombination.

Moreover, while methods may be depicted in the drawings or described in the specification in a particular order, such methods need not be performed in the particular order shown or in sequential order, and that all methods need not be performed, to achieve desirable results. Other methods that are not depicted or described can be incorporated in the example methods and processes. For example, one or more additional methods can be performed before, after, simultaneously, or between any of the described methods. Further, the methods may be rearranged or reordered in other implementations. Also, the separation of various system components in the implementations described above should not be understood as requiring such separation in all implementations, and it should be understood that the described components and systems can generally be integrated together in a single product or packaged into multiple products. Additionally, other implementations are within the scope of this disclosure.

Conditional language, such as "can," "could," "might," or "may," unless specifically stated otherwise, or otherwise understood within the context as used, is generally intended to convey that certain embodiments include or do not include, certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than or equal to 10% of, within less than or equal to 5% of, within less than or equal to 1% of, within less than or equal to 0.1% of, and within less than or equal to 0.01% of the stated amount. If the stated amount is 0 (e.g., none, having no), the above recited ranges can be specific ranges, and not within a particular % of the value. For example, within less than or equal to 10 wt./vol. % of, within less than or equal to 5 wt./vol. % of, within less than or equal to 1 wt./vol. % of, within less than or equal to 0.1 wt./vol. % of, and within less than or equal to 0.01 wt./vol. % of the stated amount.

Some embodiments have been described in connection with the accompanying drawings. The figures are drawn to scale, but such scale should not be limiting, since dimensions and proportions other than what are shown are contemplated and are within the scope of the disclosed inventions. Distances, angles, etc. are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments can be used in all other embodiments set forth herein. Additionally, it will be recognized that any methods described herein may be practiced using any device suitable for performing the recited steps.

While a number of embodiments and variations thereof have been described in detail, other modifications and methods of using the same will be apparent to those of skill in the art. Accordingly, it should be understood that various applications, modifications, materials, and substitutions can be made of equivalents without departing from the unique and inventive disclosure herein or the scope of the claims.

What is claimed is:

1. A method of forming an integrated microstrip circulator, the method comprising:
    translating a ferrite disc into an aperture in a dielectric substrate;
    securing the ferrite disc in the dielectric substrate with an adhesive to form a composite structure; and
    forming circuitry on an upper surface of the composite structure and forming surface mount contacts on a lower surface of the composite structure by metallizing the upper and lower surfaces of the composite structure.

2. The method of claim 1 wherein the ferrite disc is a yttrium iron garnet disc.

3. The method of claim 1 further comprising forming vias on sections of a peripheral surface of the dielectric substrate, the vias providing electrical communication between the circuitry and the surface mount contacts.

4. The method of claim 3 wherein the vias are formed within recesses defined in the peripheral surface of the dielectric substrate.

5. The method of claim 1 further including adding additional radio frequency components onto the dielectric substrate.

6. The method of claim 1 further including slicing the composite structure to a particular thickness, wherein each slice contains both a portion of the ferrite disc and a portion of the dielectric substrate.

7. The method of claim 1 further including contacting a magnetic disc onto the composite structure to form a microstrip waveguide circulator.

8. The method of claim 1 wherein the adhesive is an inorganic adhesive.

9. The method of claim 1 further including applying one or more of a coupler, switch, or load to the dielectric substrate.

10. The method of claim 1 further comprising preparing the dielectric substrate with an inner area and an outer area, the inner area having a different dielectric constant than the outer area.

11. The method of claim 1 further comprising preparing the dielectric substrate with an inner area and an outer area, the inner area having a higher dielectric constant than the outer area.

12. The method of claim 1 further comprising forming a metallized central portion on a lower surface of the dielectric substrate.

13. The method of claim 12 wherein forming the surface mount contacts on the lower surface of the composite structure includes forming the surface mount contacts on a periphery of the lower surface of the dielectric substrate and electrically separated from the metallized central portion.

14. The method of claim 1 further comprising forming a ground plane on a central portion of a lower surface of the dielectric substrate.

15. The method of claim 1 wherein forming the circuitry on the upper surface of the composite structure includes forming curved conductive traces on an upper surface of the dielectric substrate that provide a portion of an electrical path between metallization on an upper surface of the ferrite disc and the surface mount contacts.

16. A method of forming an integrated microstrip circulator, the method comprising:
    preparing a ferrite disc;
    preparing a dielectric substrate, the dielectric substrate having an aperture;
    translating the ferrite disc into the aperture in the dielectric substrate;
    securing the ferrite disc in the dielectric substrate with an adhesive to form a composite structure; and
    forming circuitry on an upper surface of the composite structure and forming surface mount contacts on a lower surface of the composite structure by metallizing the upper and lower surfaces of the composite structure.

17. A method of forming a radio frequency antenna system, the method comprising:
    forming a microstrip circulator surface mounted on an external substrate, the microstrip circulator including a dielectric substrate having an aperture, a ferrite disc secured within the aperture in the dielectric substrate, metallization on upper surfaces of the dielectric substrate and ferrite disc, and surface mount contacts disposed on lower surfaces of the dielectric substrate and ferrite disc and in electrical communication with the metallization on the upper surfaces of the dielectric substrate and ferrite disc;
    disposing a transmit power amplifier on the external substrate in electrical communication with the microstrip circulator;
    disposing a receive low noise amplifier on the external substrate in electrical communication with the microstrip circulator; and
    disposing a filter on the external substrate in electrical communication with the microstrip circulator.

18. The method of claim 17 wherein the microstrip circulator is secured within the aperture in the dielectric substrate with an inorganic adhesive.

19. The method of claim 17 further including applying one or more of a coupler, switch, or load to the external substrate.

20. The method of claim 17 further comprising forming vias on sections of a peripheral surface of the dielectric substrate, the vias providing electrical communication between the metallization on the upper surfaces of the dielectric substrate and ferrite disc and the surface mount contacts.

* * * * *